US012563831B2

(12) United States Patent
Peng et al.

(10) Patent No.: US 12,563,831 B2
(45) Date of Patent: Feb. 24, 2026

(54) SEMICONDUCTOR DEVICE HAVING MIXED CMOS ARCHITECTURE AND METHOD OF MANUFACTURING SAME

(71) Applicant: TAIWAN SEMICONDUCTOR MANUFACTURING COMPANY, LTD., Hsinchu (TW)

(72) Inventors: Shih-Wei Peng, Hsinchu (TW); Chun-Yen Lin, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 512 days.

(21) Appl. No.: 17/886,145

(22) Filed: Aug. 11, 2022

(65) Prior Publication Data

US 2024/0055430 A1     Feb. 15, 2024

(51) Int. Cl.
| | |
|---|---|
| *H10D 84/85* | (2025.01) |
| *H10D 62/10* | (2025.01) |
| *H10D 62/13* | (2025.01) |
| *H10D 62/17* | (2025.01) |
| *H10D 64/01* | (2025.01) |

(Continued)

(52) U.S. Cl.
CPC ......... H10D 84/856 (2025.01); H10D 62/119 (2025.01); H10D 62/151 (2025.01); H10D 62/221 (2025.01); H10D 64/017 (2025.01); H10D 84/017 (2025.01); H10D 84/038 (2025.01)

(58) Field of Classification Search
CPC .............. H10D 84/856; H10D 64/017; H10D 62/221; H10D 62/151; H10D 62/119; H10D 84/017; H10D 84/038
See application file for complete search history.

(56) References Cited

U.S. PATENT DOCUMENTS

| | | | |
|---|---|---|---|
| 2020/0235098 A1 | 7/2020 | Li et al. | |
| 2021/0249401 A1 | 8/2021 | Shiraki | |
| 2021/0366902 A1 | 11/2021 | Sobue | |

(Continued)

FOREIGN PATENT DOCUMENTS

| | | | | | |
|---|---|---|---|---|---|
| CN | 114628332 A | * | 6/2022 | ..... | H01L 21/823418 |
| DE | 112020002838 B4 | * | 10/2024 | ....... | H01L 21/02532 |
| TW | 202040791 | | 11/2020 | | |

*Primary Examiner* — Eliseo Ramos Feliciano
*Assistant Examiner* — Timothy Edward Duren
(74) *Attorney, Agent, or Firm* — Hauptman Ham, LLP

(57) ABSTRACT

A semiconductor device (having a CMOS architecture) includes first to fourth cell regions Each of the first and second cell regions includes a pair of first and second stacks of nanosheets relative to, e.g., the Z-axis. The nanosheets of the first stack have a first dopant-type, e.g., N-type. The nanosheets of the second stack have a second dopant type, e.g., P-type. Each pair of first and second stacks represents a CMOS architecture relative to a second direction, e.g., the Y-axis Each of the third and fourth cell regions has CFET architecture, the CFET architecture being a type of CMOS architecture relative to the Z-axis. The third and fourth cell regions are adjacent each other relative to the Y-axis. The first and second active regions are on corresponding first and second sides of each of the third and fourth active regions. The first and second cell regions are non-CFET cell regions.

20 Claims, 29 Drawing Sheets

(51) Int. Cl.
  *H10D 84/01*          (2025.01)
  *H10D 84/03*          (2025.01)

(56)                    References Cited

U.S. PATENT DOCUMENTS

2022/0190161 A1 *    6/2022  Miller ................ H10D 30/6735
2023/0402513 A1 *   12/2023  Galatage ............. H10D 62/121

* cited by examiner

SEMICONDUCTOR DEVICE HAVING MIXED CMOS ARCHITECTURE AND METHOD OF MANUFACTURING SAME

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

A basic complementary field effect transistor (CFET) includes a stack of first and second active regions in which the second active region is stacked over the first active region.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
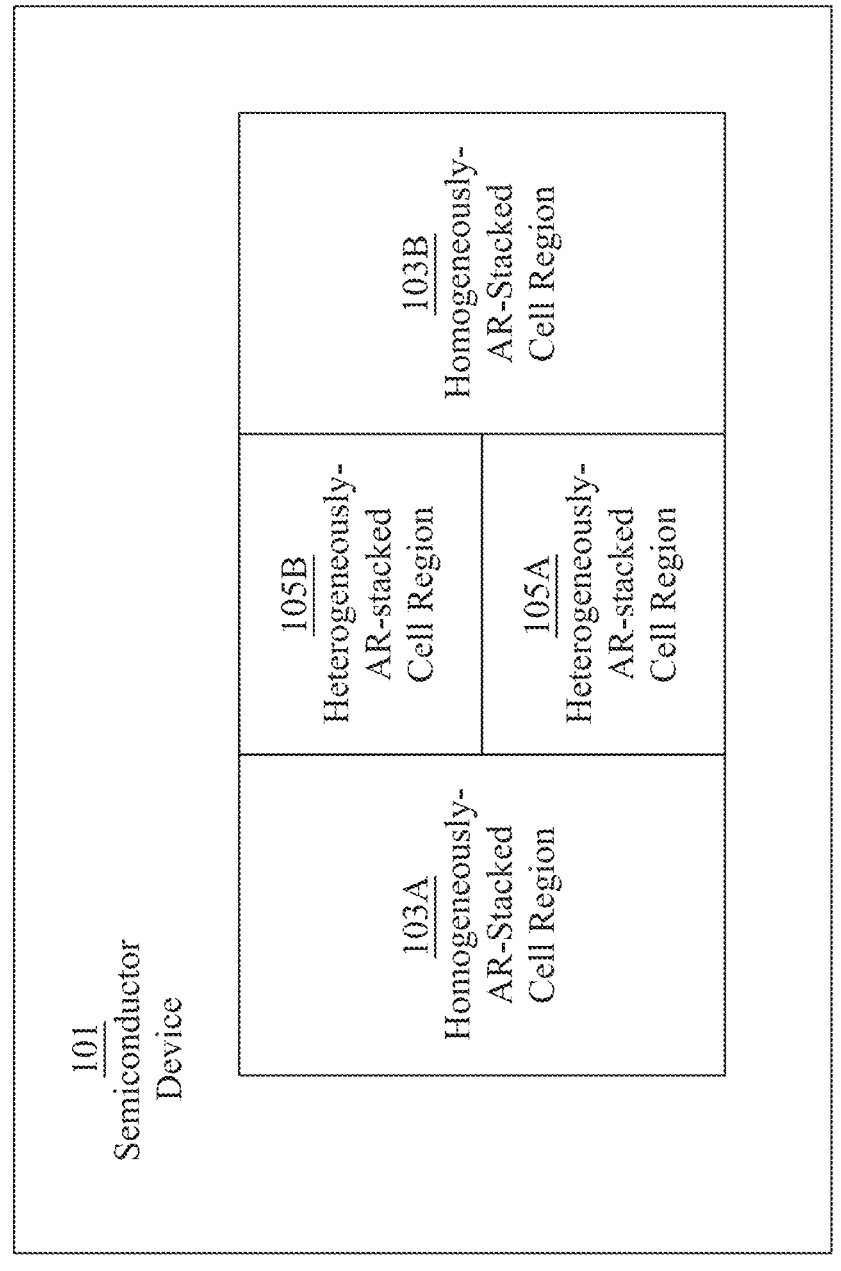
FIG. 1 is a block diagram of a semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a mixed CMOS architecture includes two half-height CFET cell regions stacked on each other relative to a first direction (e.g., Z-axis). Taken together, the two stacked half-height CFET cell regions have the height of a single cell region. The mixed CMOS architecture further includes a third single height non-CMOS cell region abutting first sides of the two stacked half-height CFET cell regions relative to a second direction (e.g., X-axis). In some embodiments, the mixed CMOS architecture further includes a fourth single height non-CMOS cell region abutting second sides of the two stacked half-height CFET cell regions. The mixed CMOS architecture exhibits less in the way of substantial step-change in an intersection-location. The intersection-location refers to intersection of a reference line (extending in the third direction, e.g., the Y-axis) as the reference line is swept along the second direction (e.g., the X-axis). In a context in which cell-height is measured relative to, e.g., the Y-axis, a substantial step-change refers to a substantial difference in the intersection location at the transition between immediately adjacent cell regions. A contrast between present embodiments and another approach, which reveals advantages of present embodiments, will be discussed.

The other approach uses a uniform CMOS architecture in which each cell region is a non-CFET cell region. In addition to single height cell regions, the other approach uses cell regions of different heights (e.g., double height, triple height, or greater) in order to achieve cell regions of different current capability. According to the other approach, where non-CFET cell regions of differing heights abut relative to the X-axis, e.g., a single height non-CFET cell region abutting a double height non-CFET cell region, there is step-change in the intersection-location at the transition from the border of the single height non-CFET cell to the border of the double height non-CFET cell region where the single height cell region abuts the double height cell region. Step-changes in intersection-location of abutting cells in a layout diagram according to the other approach are susceptible to layout-dependent effects (LDEs) such as increased rounding of structures, threshold-voltage variation, or the like, in a semiconductor device based on the layout diagram. By contrast, a mixed CMOS architecture according to present embodiments, exhibits less in the way of substantial step-change in the intersection-location. Because the mixed CMOS architecture according to present embodiments exhibits less in the way of substantial step-change in the intersection-location, semiconductor devices based on layout diagrams which incorporate the mixed CMOS architecture are less susceptible to layout-dependent effects (LDEs) such as increased rounding of structures, threshold-voltage variation, or the like, as compared to the other approach.

FIG. 1 is a block diagram of a semiconductor device 101, in accordance with some embodiments.

Semiconductor device 101 includes cell regions 103A-103B and 105A-105B. Relative to a first direction, e.g., parallel to the X-axis, each of cell regions 105A and 105B is between cell regions 103A and 103B. Relative to a second direction perpendicular to the first direction, e.g., the second direction being parallel to the Y-axis, cell region 105B is over cell region 105A. Cell regions 105A-105B are aligned relative to the X-axis. Cell region 105A abuts cell region 105B. Cell region 103A abuts cell region 105A and/or cell region 105B. Cell region 103B abuts cell region 105A and/or cell region 105B.

Figure 2A:
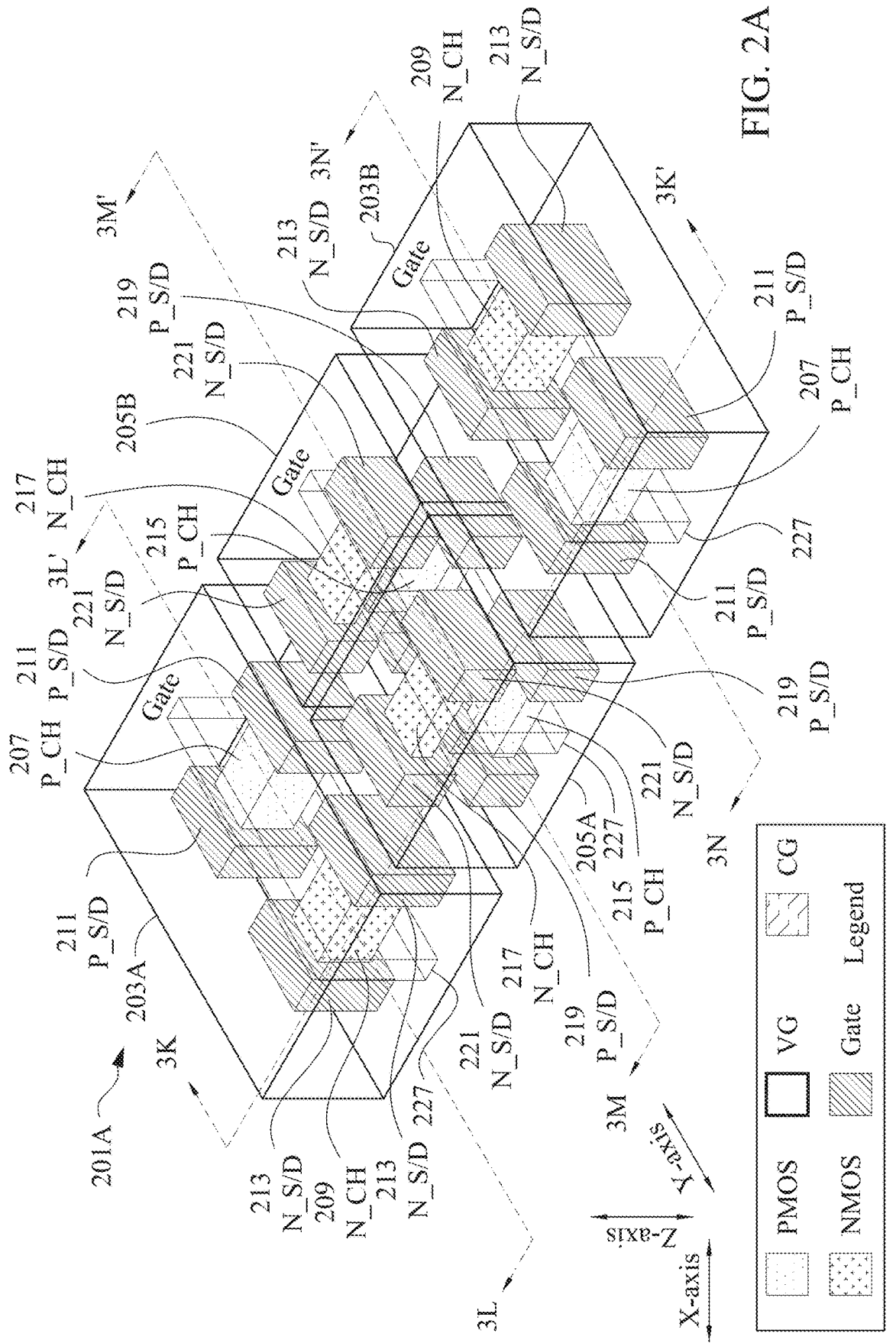
FIG. 2A is a three-quarter perspective diagram of a semiconductor device, in accordance with some embodiments.
Figure 2B:
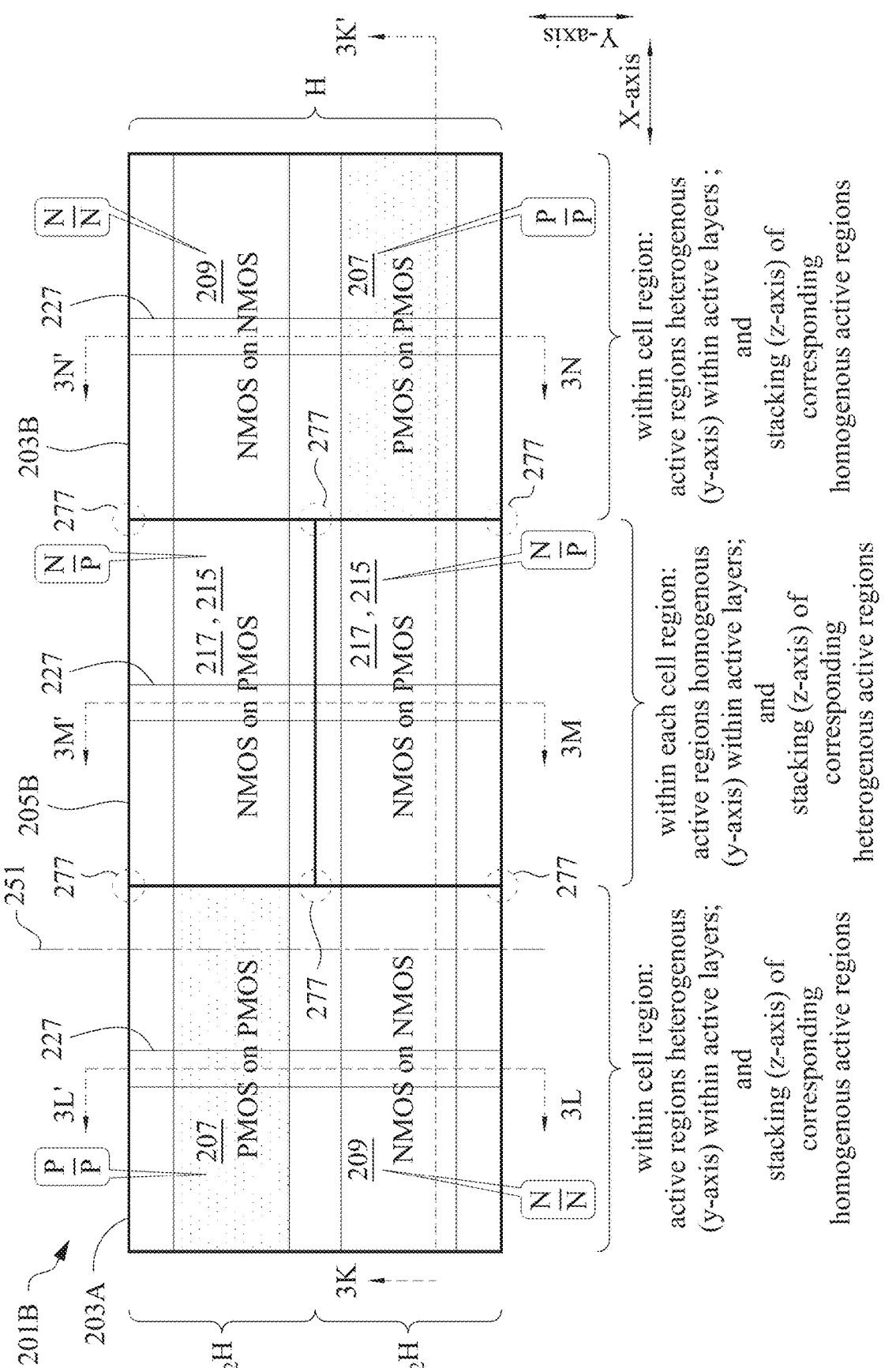
FIG. 2B is a layout diagram of a semiconductor device, in accordance with some embodiments.
Figure 2C:
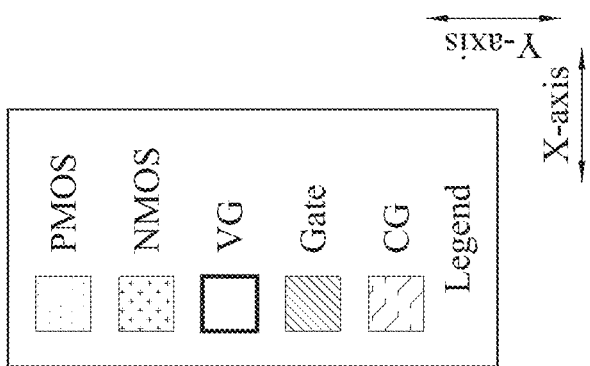
FIGS. 2C-2D are corresponding layout diagrams of semiconductor device, in accordance with some embodiments.
Figure 2D:
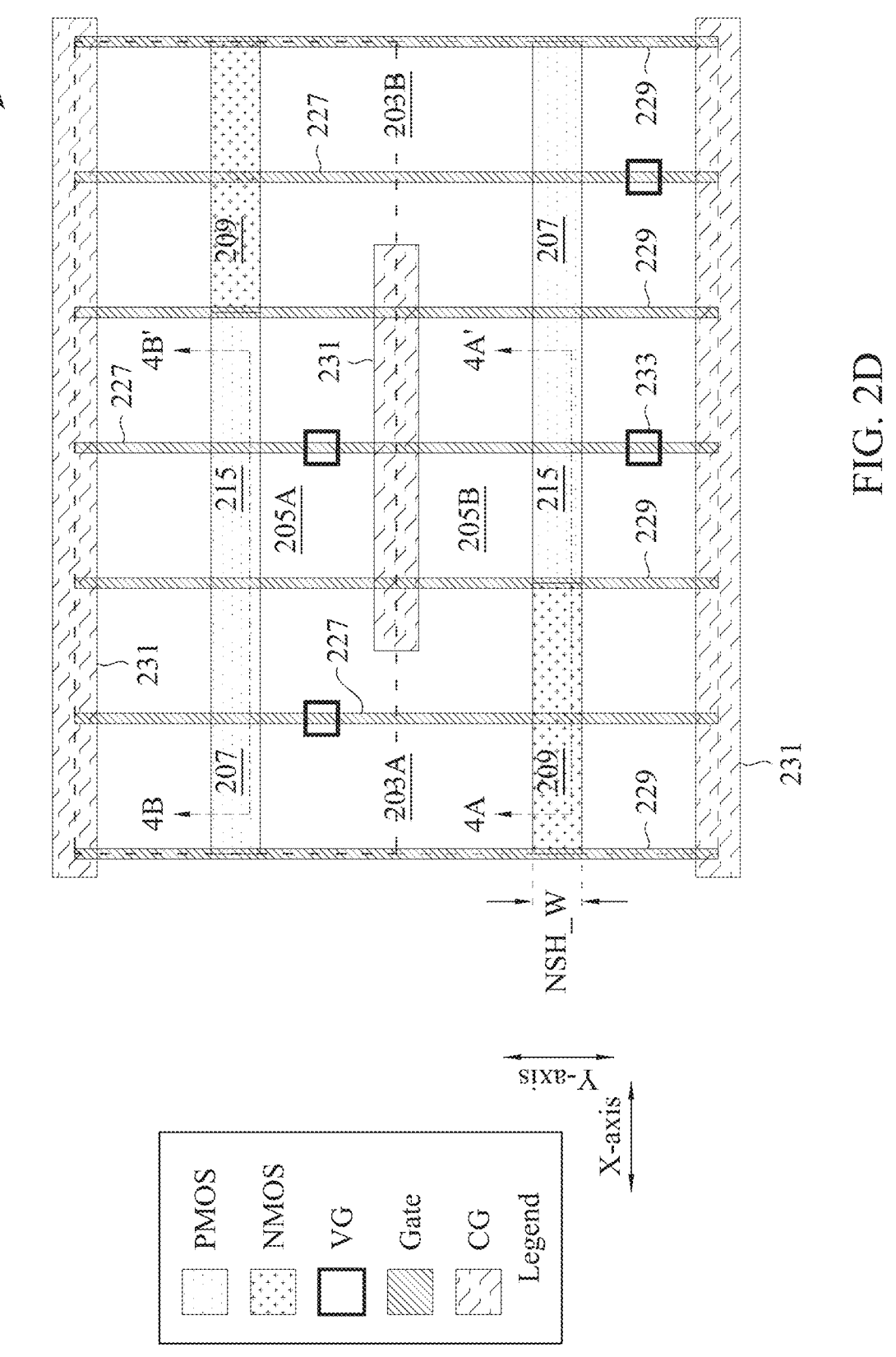
Figure 3A:
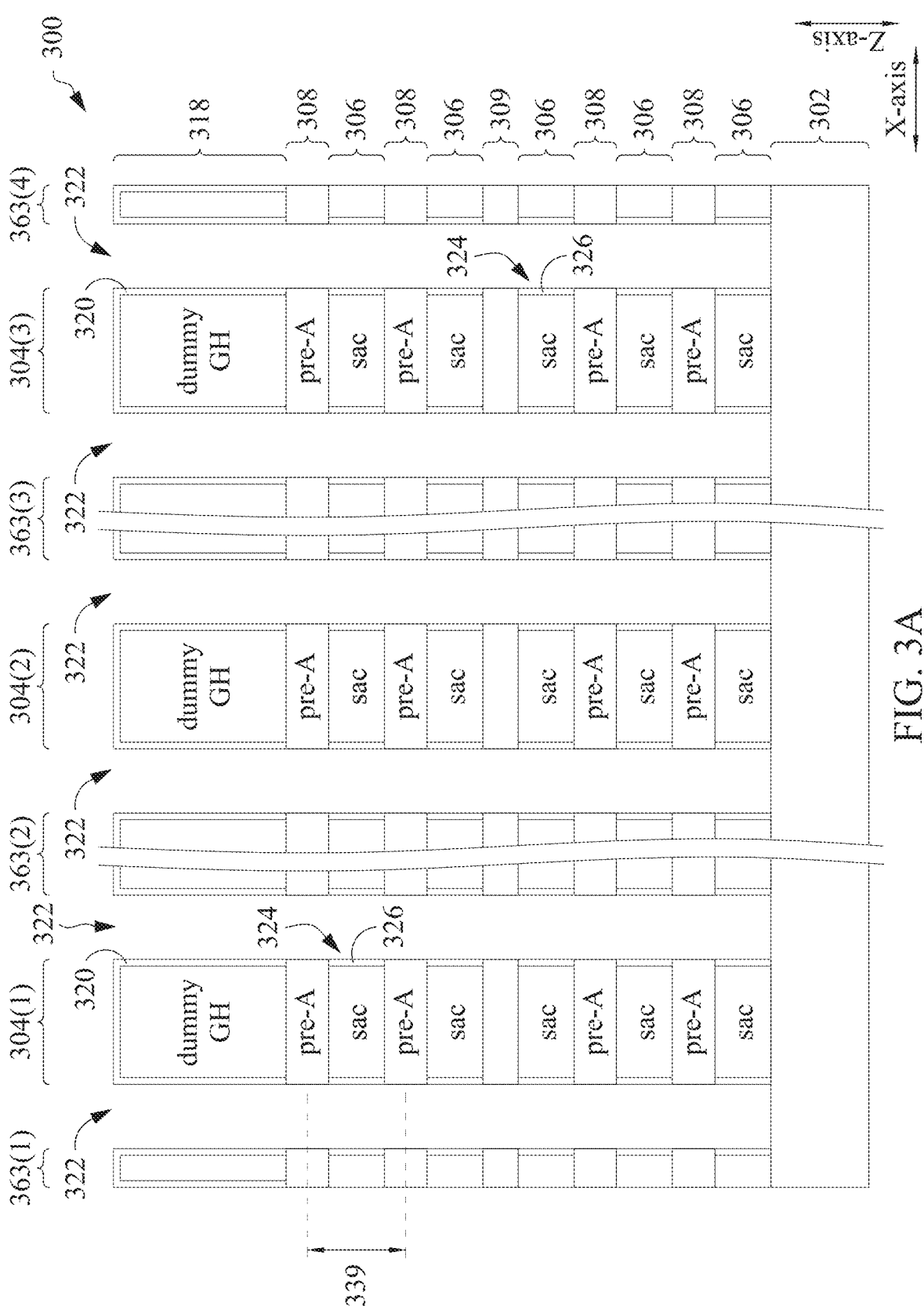
FIGS. 3A-3N are corresponding cross-sectional diagrams of a workpiece during a fabrication process, in accordance with some embodiments.
Figure 3B:
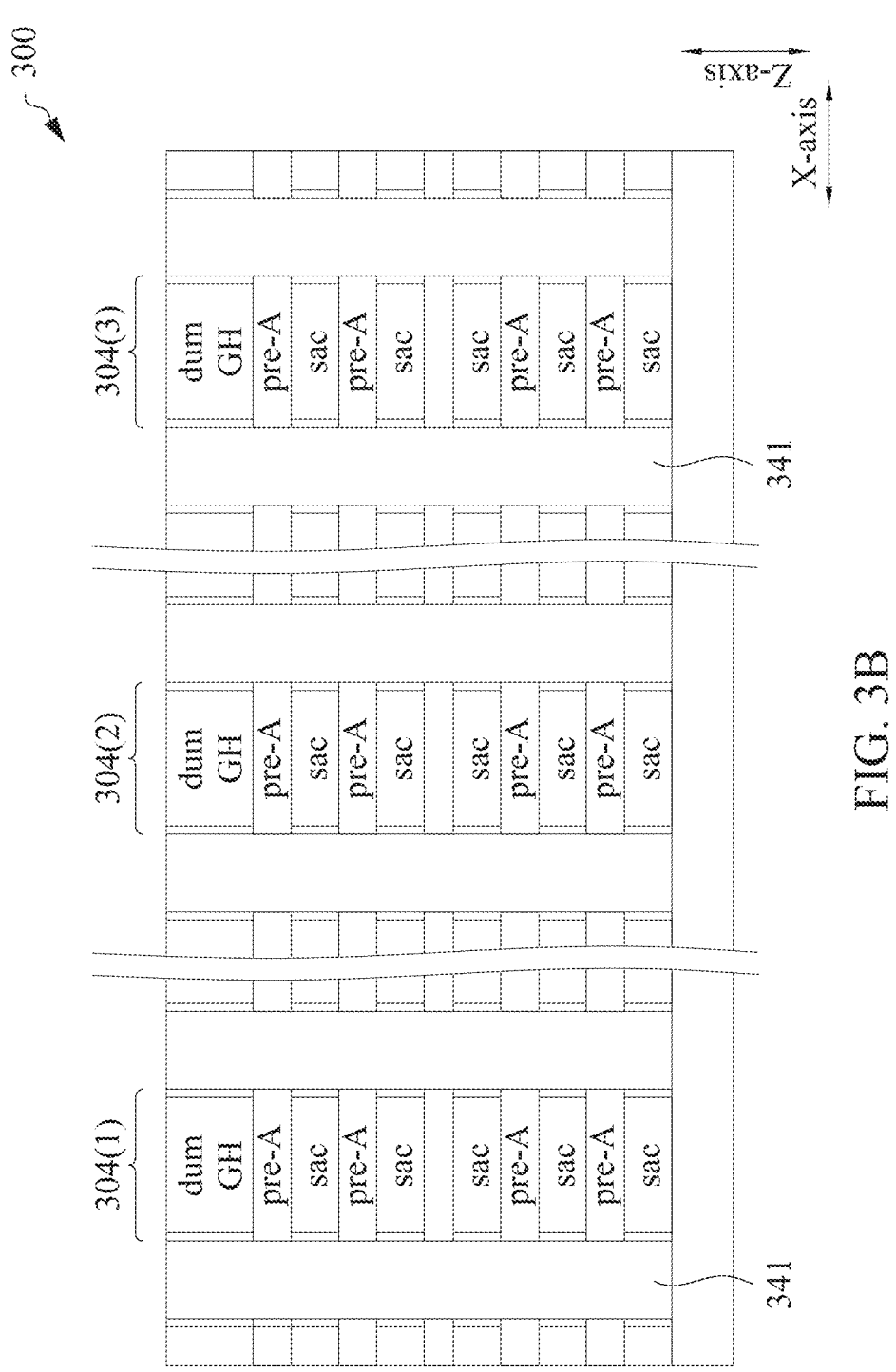
Figure 3C:
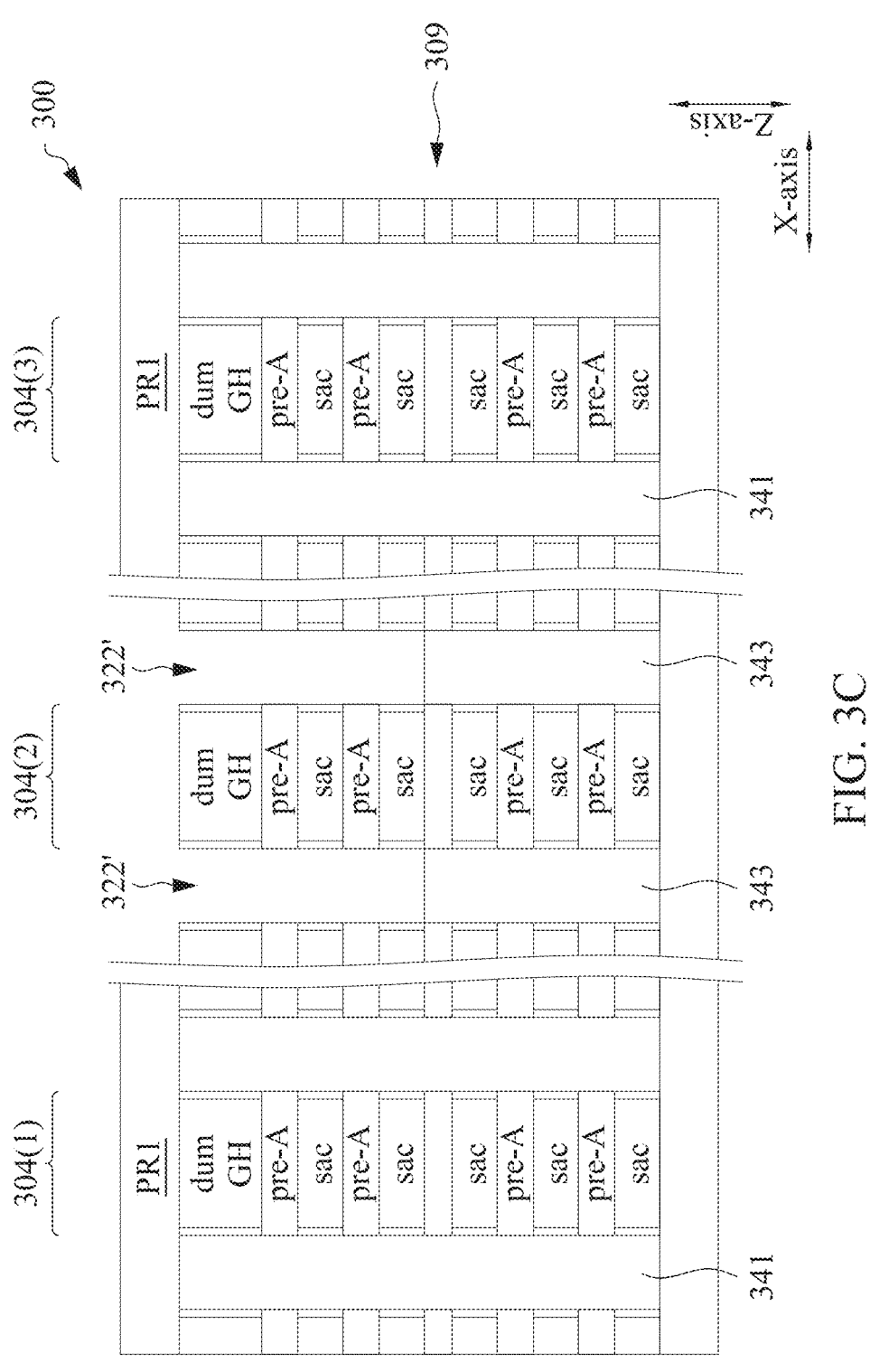
Figure 3D:
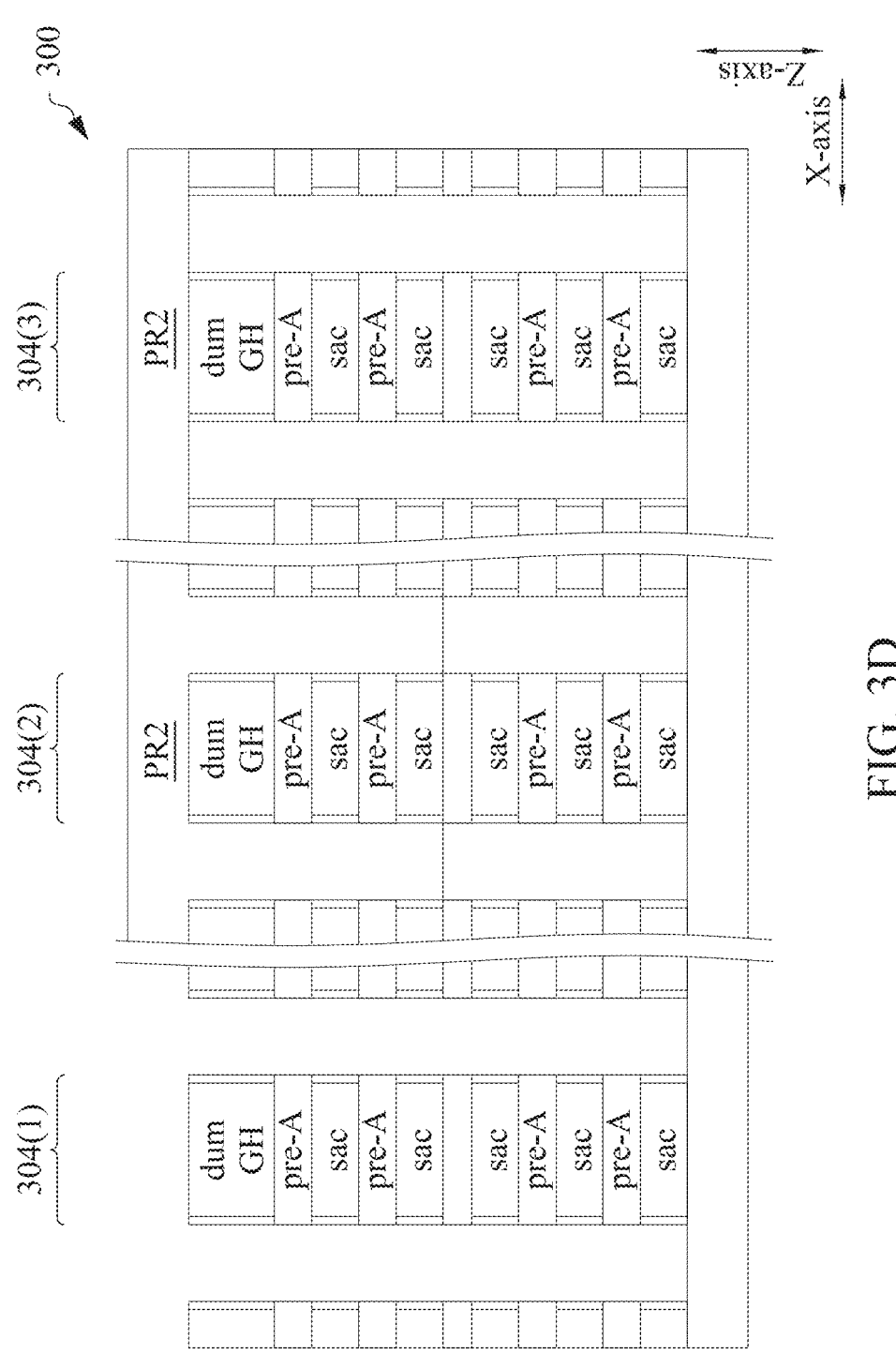
Figure 3E:
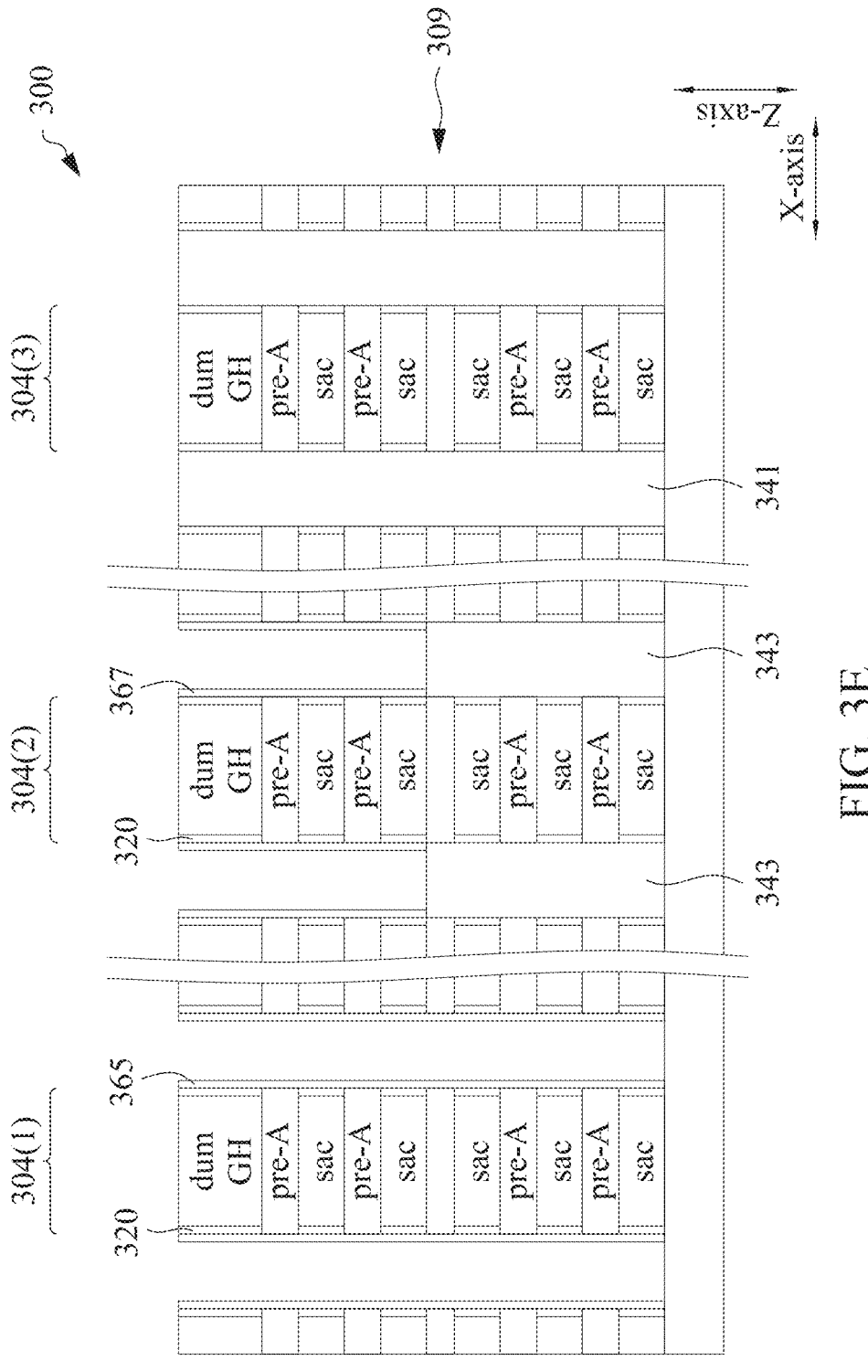
Figure 3F:
Figure 3G:
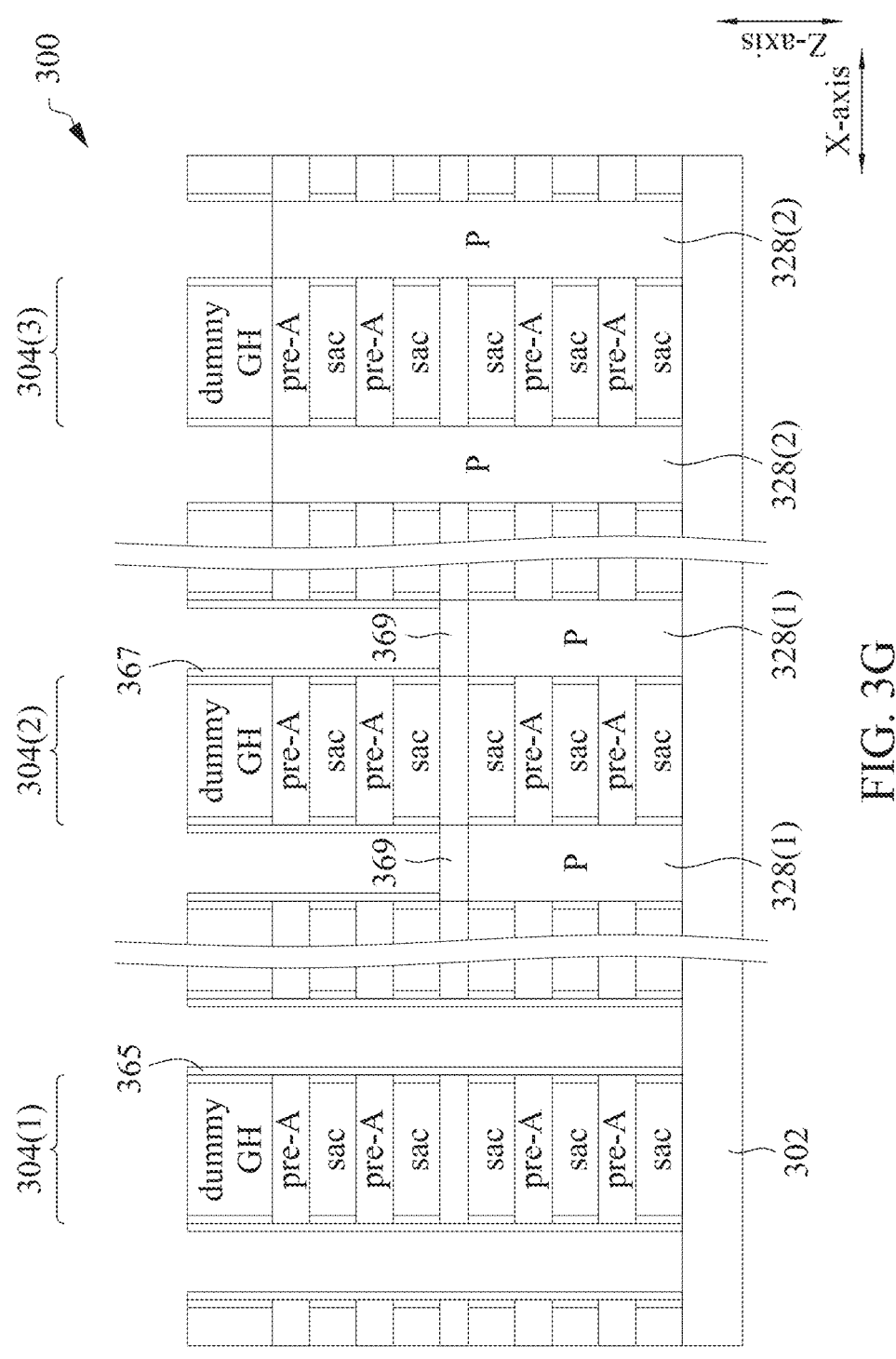
Figure 3H:
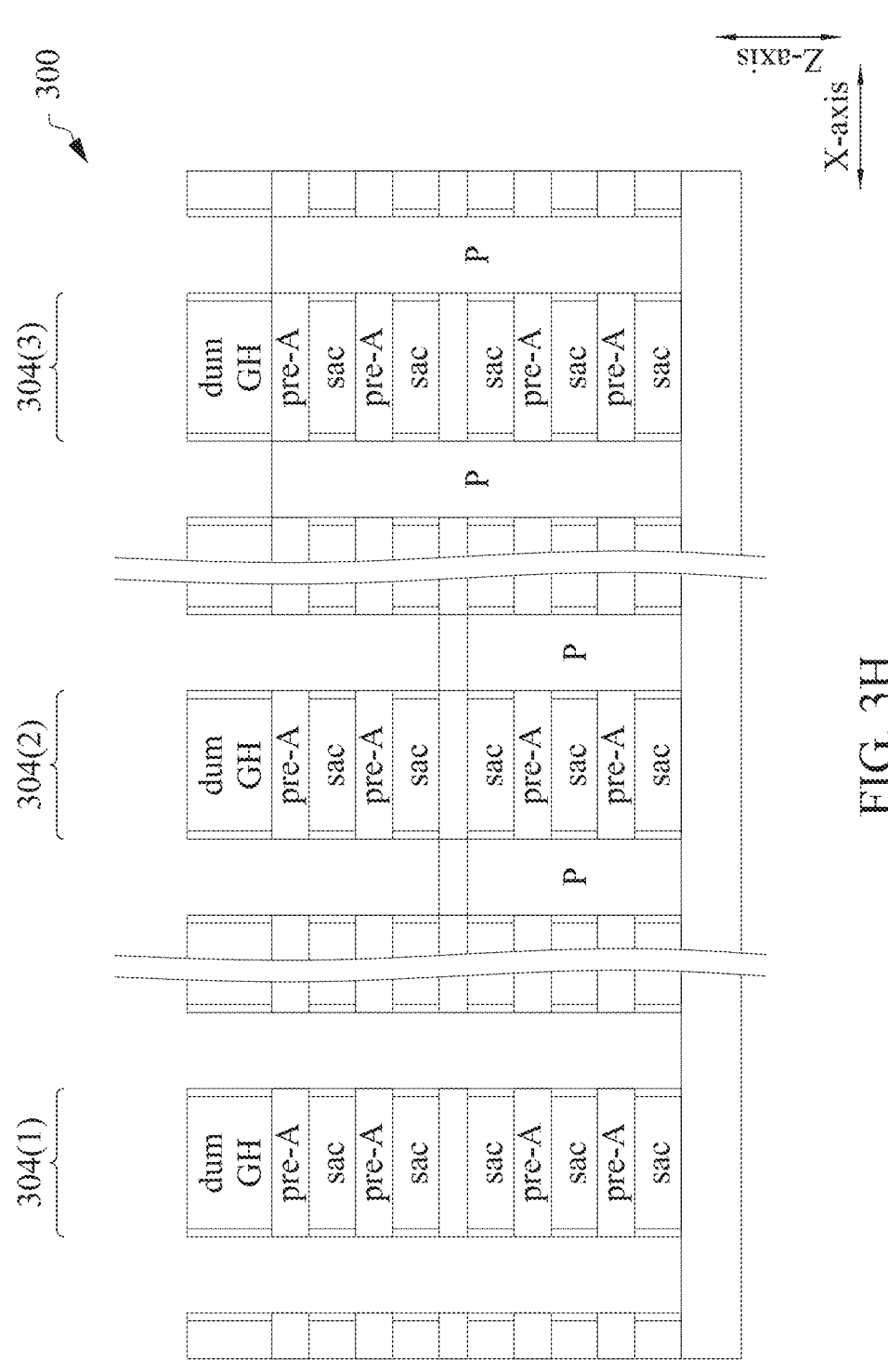
Figure 3I:
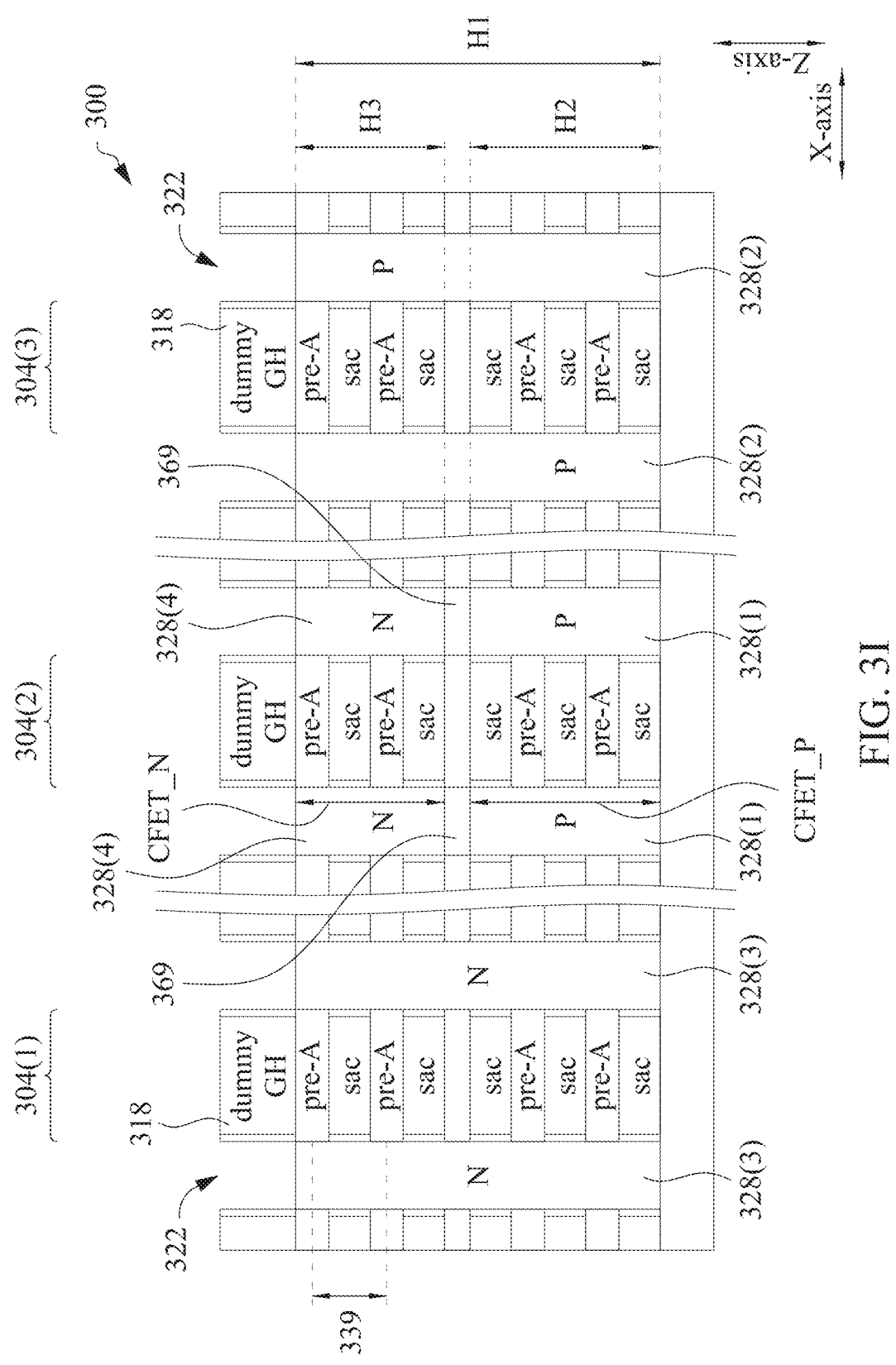
Figure 3J:
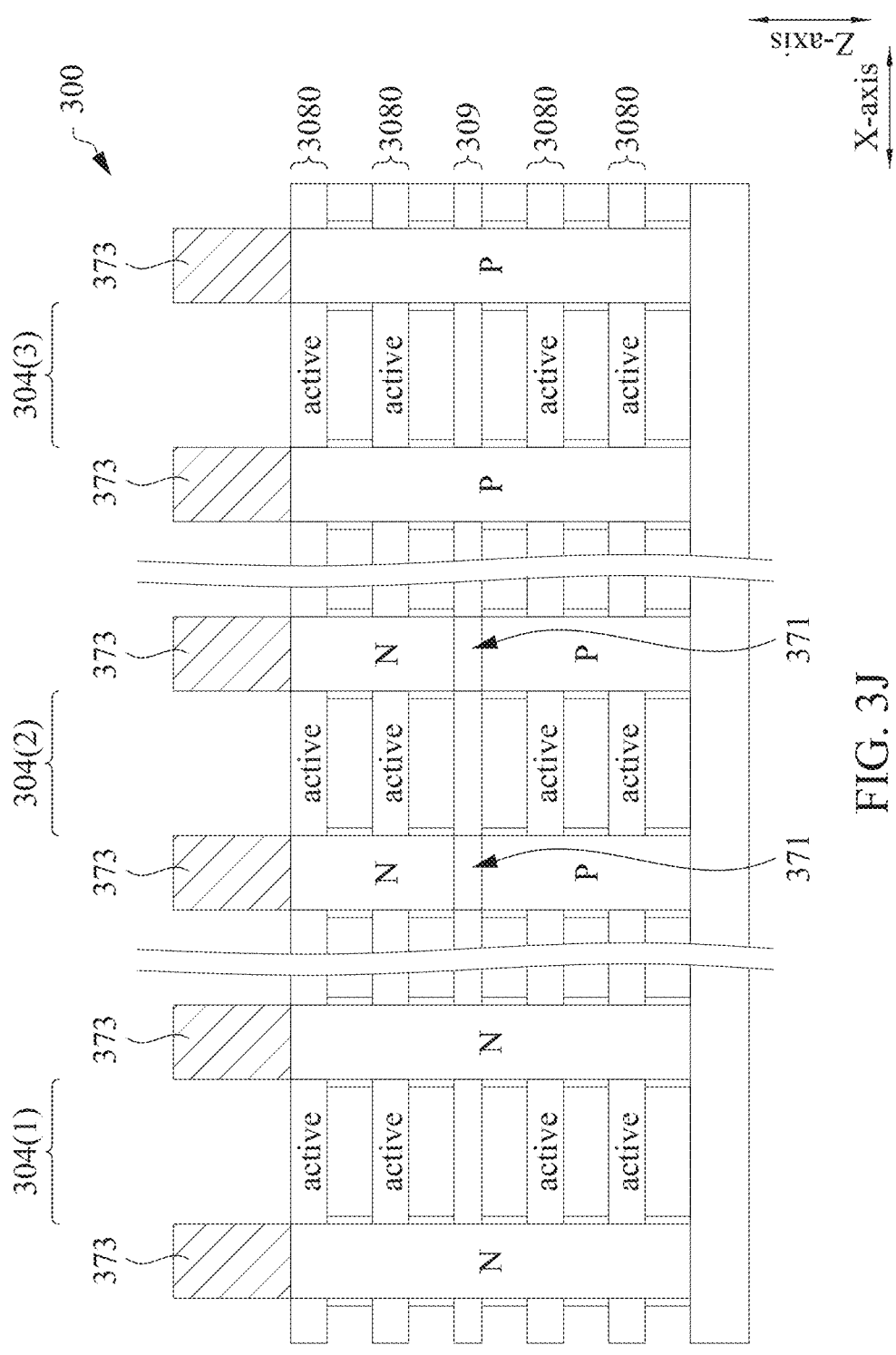
Figure 3K:
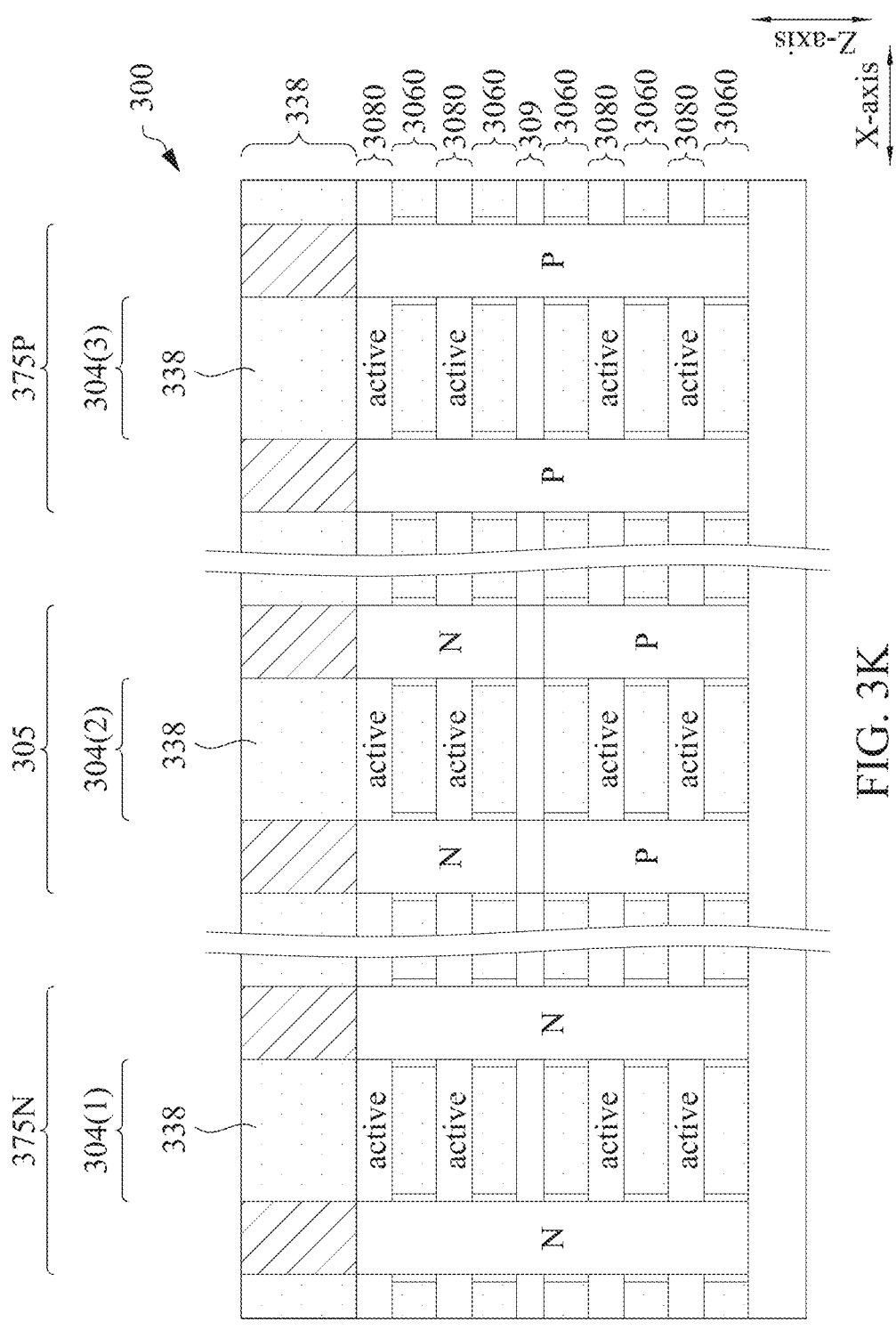
Figure 3L:
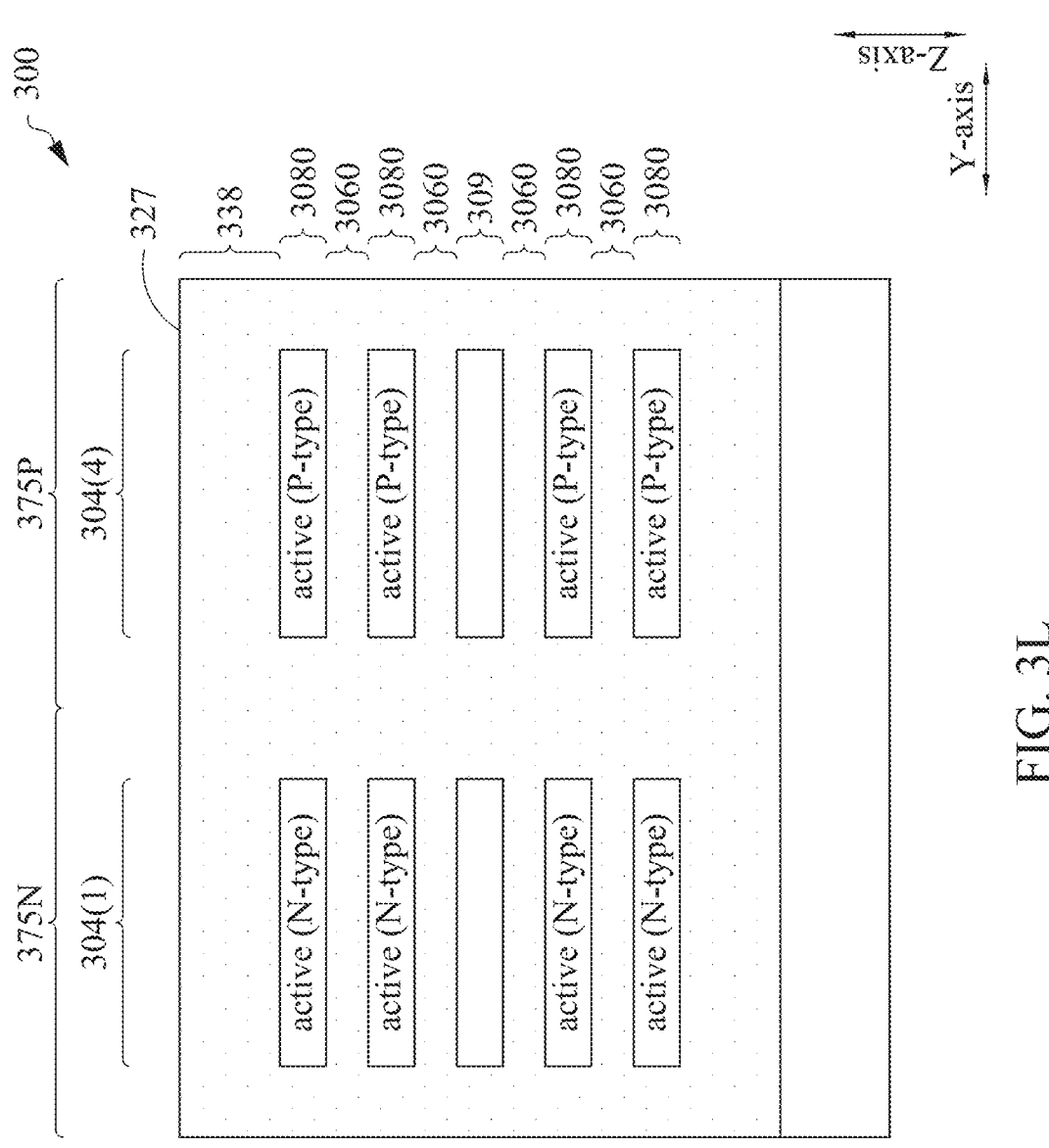
Figure 3M:
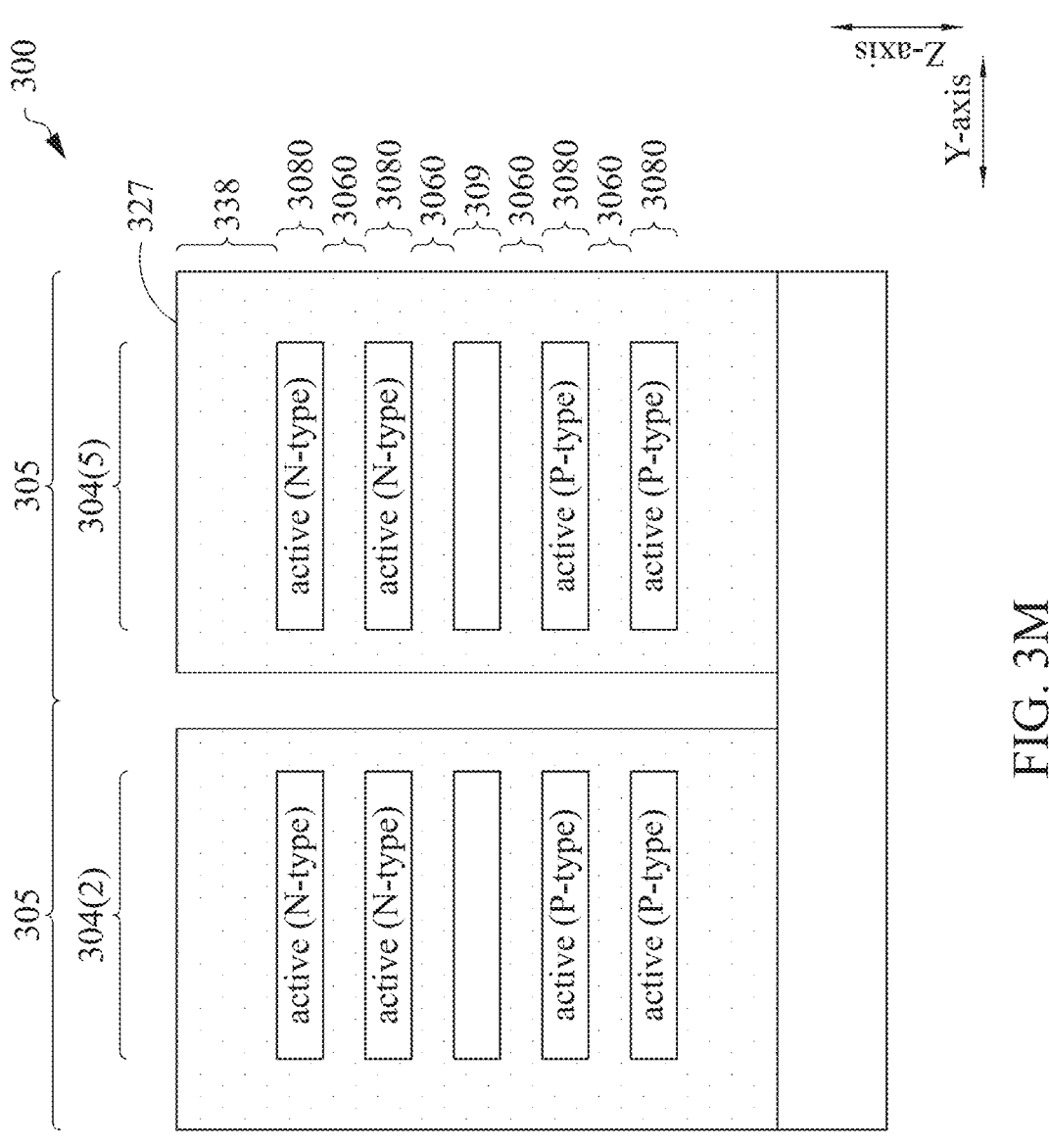
Figure 3N:
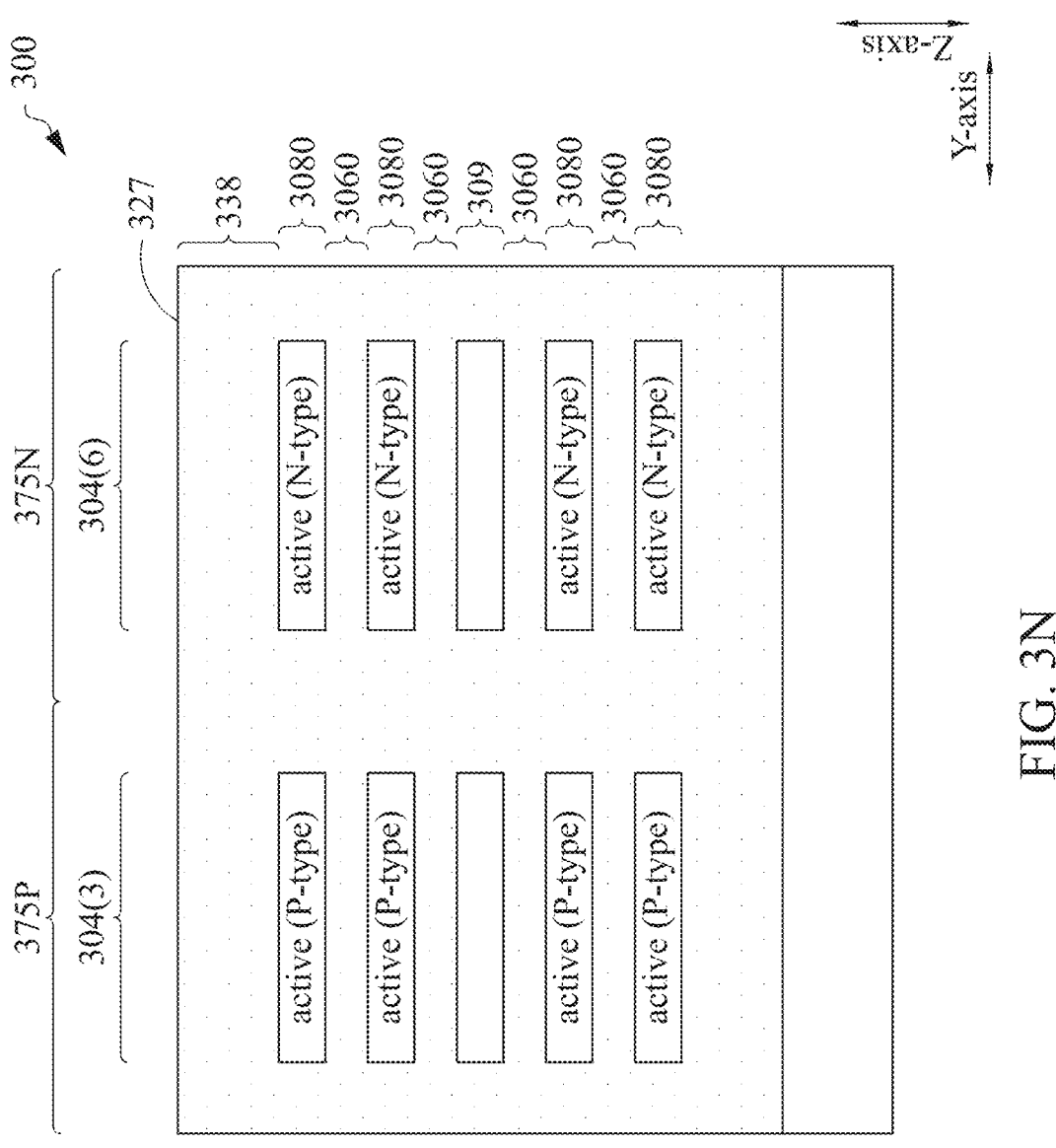

In FIG. 1, each of cell regions 103A-103B and 105A-105B includes two or more layers, each of the layers having one or more active regions (FIGS. 2A-2D, or the like); such layers are referred to herein as active layers (FIGS. 3A-3N). For each of cell regions 103A-103B and 105A-105B, the active layers have a stratified arrangement (FIGS. 3A-3N) relative to a third direction perpendicular to each of the first and second directions, e.g., the third direction being parallel to the Z-axis.

For each of cell regions 103A and 103B, the following is true. Each active layer includes first and second active regions (ARs) of correspondingly different dopants such that each active layer is heterogeneous in terms of dopant type. Within each layer, and relative to one of the X-axis or Y-axis, e.g., the Y-axis, because each of the active layers is heterogeneous in terms of dopant type, each of the active layers has a complementary metal oxide semiconductor (CMOS) architecture. The first active regions are in a first stack over each other that represents a first channel structure (FIG. 2A) and the second active regions are in a second stack over each other that represents a second channel structure. Each of the first and second channel structures (FIG. 2A) is correspondingly homogeneous in terms of dopant type. Accordingly, each of cell regions 103A and 103B is described as a homogeneously-AR-stacked (homo-stacked) cell region. In terms of AR-pairing, within each active layer: the first and second active regions are paired relative to the Y-axis; and the first and second channel structures are paired relative to the Y-axis. In some embodiments in which horizontal is understood in a context of an X-Y plane defined by the X-axis and Y-axis, pairing relative to the Y-axis is referred to as horizontal pairing. In some embodiments, each active region has a nanosheet architecture.

In FIG. 1, for each of cell regions 105A and 105B, the following is true. Each active layer includes a single active region such that each active layer is homogeneous in terms of dopant type. The active layers are stratified with the single active regions therein being aligned in a stack over each other. Relative to the Z-axis, an interior one of the active layers is replaced with an isolation boundary layer. In each of cell regions 105A and 105B, the single active regions below the isolation boundary layer have the first dopant type and represent a first channel structure (FIG. 2A). In each of cell regions 105A and 105B, the single active regions above the isolation boundary layer have the second dopant type and represent a second channel structure (FIG. 2A). Accordingly, each channel structure in each of the first and second channel structures in each of cell regions 105A and 105B is homogeneous in terms of dopant type. In each of cell regions 105A and 105B, the first and second channel structures are stacked relative to the Z-axis. While each channel structure is homogeneous in terms of dopant type, nevertheless each stack of first and second channel structures is heterogeneous in terms of dopant type relative to the Z-axis. Accordingly, each of cell regions 105A and 105B is described as a heterogeneously-AR-stacked (hetero-stacked) cell region. Because each stack is heterogeneous in terms of dopant type relative to the Z-axis, each of cell regions 105A and 105B has a complementary field effect transistor (CFET) architecture, the CFET architecture being a type of CMOS architecture relative to the Z-axis. In terms of AR-pairing, within each of cell regions 105A and 105B, the first and second active regions are paired relative to the Z-axis. Also, in terms of AR-pairing, considering cell regions 105 and 105B together, the first and second stacks of ARs are paired relative to the Z-axis. In some embodiments, each active region has a nanosheet architecture (FIGS. 3A-3N). In some embodiments in which vertical is understood in a context of the Z-axis, pairing relative to the Z-axis is referred to as vertical pairing.

In FIG. 1, cell regions 103A-103B have a type of CMOS architecture that is different than the type of CMOS architecture in cell regions 105A-105B. Accordingly, semiconductor device 101 is referred to as having a mixed-CMOS type of architecture.

FIG. 2A is a three-quarter perspective diagram of a semiconductor device 201A, in accordance with some embodiments.

Semiconductor device 201A has a mixed-CMOS type of architecture. Semiconductor device 201A is an example of semiconductor device 101 of FIG. 1. Semiconductor device 201A includes cell regions 203A-203B and 205A-205B. Cell regions 203A and 203B are homo-stacked cell regions that correspond to cell regions 103A and 103B of FIG. 1. Cell regions 205A and 205B are hetero-stacked cell regions that correspond to cell regions 105A and 105B of FIG. 1. Section line 3K-3K' in FIG. 2A corresponds to FIG. 3K. Section lines 3L-3L', 3M-3M' and 3N-3N' in FIG. 2A correspond to FIGS. 3L, 3M and 3N.

In FIG. 2A, each of cell regions 203A and 203B includes: a channel (CH) structure 207 formed between corresponding source/drain (S/D) regions 211 which have a first type of doping; a channel structure 209 formed between corresponding S/D regions 213 which have a second type of doping; and a gate structure 227 that surrounds each of channel structures 207 and 209 in a gate-all-around (GAA) configuration. An example of the first type of doping is P-type doping used in a positive-channel field effect (PMOS) transistor technology. An example of the second type of doping is N-type doping used in a negative-channel field effect (NMOS) transistor technology. Channel structure 207 extends in the direction of the X-axis between S/D regions 211. Channel structure 209 extends along the direction of the X-axis between S/D regions 213. Channel structures 207 and 209 are separated by a gap relative to the Y-axis. In some embodiments, semiconductor device 201A is oriented correspondingly with respect to first, second and third orthogonal directions other than the X-axis, Y-axis and Z-axis.

Each of cell regions 203A and 203B has a stratified arrangement of active layers (FIGS. 3A-3N) relative to the Z-axis. Each active layer correspondingly includes a portion of P-type channel structure 207 representing a P-type active region and a portion of N-type channel structure 209 representing an N-type active region. In some embodiments, each active region in each active layer is a nanosheet. In some embodiments, each active region in each active layer is a nanowire. In some embodiments, each active region is a type of region other than a nanosheet or nanowire.

In FIG. 2A, each of cell regions 205A and 205B includes: a channel (CH) structure 215 having a first type of doping, e.g., P-type, formed between corresponding S/D regions 219; a channel structure 217 having a second type of doping, e.g., N-type, formed between corresponding S/D regions 221; and a gate structure 227 that surrounds each of channel structures 215 and 217 in a gate-all-around (GAA) configuration. Channel structure 215 extends in the direction of the X-axis between S/D regions 219. Channel structure 217 extends along the direction of the X-axis between S/D regions 221. Channel structures 215 and 217 are separated by a gap relative to the Z-axis. Each of cell regions 205A and 205B has a stratified arrangement of active layers (FIGS. 3A-3N) relative to the Z-axis.

In each of cell regions 205A and 205B, in P-type channel structure 215, each active layer includes a single P-type active region. In N-type channel structure 217, each active layer includes a single N-type active region. In some embodiments, each active region in each active layer is a nanosheet. In some embodiments, each active region in each active layer is a nanowire. In some embodiments, each active region in each active layer a type of region other than a nanosheet or nanowire.

FIG. 2B is a layout diagram 201B of a semiconductor device, in accordance with some embodiments.

Layout diagram 201B is a representation of semiconductor device 201A, and thus represents a mixed-CMOS type of architecture. Section line 3K-3K' in FIG. 2B corresponds to FIG. 3K. Section lines 3L-3L', 3M-3M' and 3N-3N' in FIG. 2B correspond to FIGS. 3L, 3M and 3N.

In general, shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, some elements in the layout diagram (e.g., FIG. 2B and the other layout diagrams disclosed herein) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2B and the other layout diagrams disclosed herein are examples of layout diagrams in which selected layers have been omitted, e.g., metallization layers & corresponding interconnection beginning with a first level of metallization are omitted in FIG. 2B. In some embodiments, the layout diagram of FIG. 2B is part of a larger layout diagram.

The arrangement of channel structures 207 and 209, and active layers therein, in each of cell regions 203A and 203B is: heterogenous along the Y-axis in terms of dopant type; and correspondingly homogeneous along the Z-axis in terms of dopant type. Channel structure 207 has a same dopant type in a direction into/out of the page of FIG. 2B. Channel structure 209 has a same dopant type in a direction into/out of the page of FIG. 2B. Channel structures 207 and 209 have a different dopant type in a direction vertically along the page of FIG. 2B.

The arrangement of channel structures 215 and 217 in each of cell regions 205A and 205B is: homogeneous along the Y-axis in terms of dopant type; and correspondingly heterogeneous along the Z-axis in terms of dopant type. In contrast to channel structures 207 and 209: each of channel structures 215 and 217 has a same dopant type in a direction vertically along the page of FIG. 2B; and channel structures 215 and 217 have a different dopant type in a direction into/out of the page of FIG. 2B. Within channel structure 215 in each of cell regions 205A and 205B, the active layers (FIGS. 3A-3N) are homogeneous in terms of dopant type, namely P-type. Within channel structure 217 in each of cell regions 205A and 205B, the active layers (FIGS. 3A-3N) are homogeneous in terms of dopant type, namely N-type.

Regarding FIG. 2B, in some embodiments in which vertical is understood in a context of the Z-axis, each of cell regions 203A and 203B has a single height, H, corresponding to a height of a single row. Each of cell regions 205A and 205B has a half-single height, ½ H. Together, cell regions 205A and 205B have a single cell height, H, where H=2* (½H).

In FIG. 2B, in terms of a reference line 251 extending parallel to the Y-axis, and further in terms of changes in intersection-location where reference line 251 intersects each cell-region-border (intersection-location) as the reference line is swept along the X-axis, the following is true: an instance of a transition 277 from cell region 203A to cell region 205A is free of a substantial step-change in the intersection-location; an instance of transition 277 from cell region 203A to cell region 205B is free of a substantial step-change in the intersection-location; an instance of transition 277 from cell region 205A to cell region 203B is free of a substantial step-change in the intersection-location; and an instance of transition 277 from cell region 205B to cell region 203B is free of a substantial step-change in the intersection-location. A contrast between present embodiments and another approach, which reveals advantages of present embodiments, will be discussed.

The other approach uses a uniform CMOS architecture in which each cell region is a non-CFET cell region that includes a PMOS active region and an NMOS active region, and wherein, relative to the first direction, the PMOS active regions therein are in corresponding first stacks over each other and the NMOS active regions therein are in corresponding second stacks over each other, and wherein each of the first and second stacks therein is correspondingly homogeneous in terms of dopant type. In the context of organizing a layout diagram representing a semiconductor device into rows that extend in a first direction, e.g., parallel to the X-axis, and where a size of the rows in a second direction, e.g., parallel to the Y-axis, is uniform and corresponds to a single height cell, in addition to single height cell regions, the other approach uses cell regions of different heights (e.g., double height, triple height, or greater) in order to achieve cell regions of different current capability. According to the other approach, where non-CFET cell regions of differing heights abut relative to the X-axis, e.g., a single height non-CFET cell region abutting a double height non-CFET cell region, there is a step-change in the intersection-location at the transition from the border of the single height non-CFET cell to the border of the double height non-CFET cell region. More particularly, where the reference line intersects the border of the single height non-CFET cell region or the double height non-CFET cell region (intersection-location) as the reference line is swept along the X-axis, the intersection-location undergoes a step-change in the intersection-location where the single height cell region abuts the double height cell region according to the other approach. Step-changes in intersection-location of abutting cells in a layout diagram according to the other approach are susceptible to layout-dependent effects (LDEs) such as increased rounding of structures, threshold-voltage variation, or the like, in a semiconductor device based on the layout diagram. By contrast, a mixed CMOS architecture according to present embodiments, e.g., semiconductor device of FIG. 2B, or the like, exhibits less in the way of substantial step-change in the intersection-location. Such a mixed CMOS architecture does so by stacking (relative to the Y-axis) two half-height CFET cell regions on each other and abutting (relative to the X-axis) the two stacked, half-height CFET cell regions with a single height non-CFET cell region, where the transition from either of the two stacked half-height cell regions to the single height non-CFET cell region is free of a substantial step-change in the intersection-location. Because the mixed CMOS architecture according to present embodiments exhibits less in the way of substantial step-change in the intersection-location, semiconductor devices based on layout diagrams which incorporate the mixed CMOS architecture are less susceptible to layout-dependent effects (LDEs) such as increased rounding of structures, threshold-voltage variation, or the like, as compared to the other approach.

FIGS. 2C-2D are corresponding layout diagrams 223 and 225 of semiconductor device, in accordance with some embodiments.

Together, layout diagrams 223 and 225 represent layout diagram 201B of FIG. 2B. More particularly, layout diagram 223 represents an upper level (with respect to the Z-axis) of layout diagram 201B whereas layout diagram 225 represents a lower level of layout diagram 201B. As such, together layout diagrams 223 and 225 are a representation of semiconductor device 201A, and thus represents a mixed-CMOS type of architecture. Section line 4A-4A' in each of FIGS. 2C-2D corresponds to FIG. 4A. Section line 4B-4B' in each of FIGS. 2C-2D corresponds to FIG. 4B.

While each of channel structures 215 and 217 in each of cell regions 205A and 205B is homogeneous in terms of dopant type, nevertheless each stack of channel structures 215 and 217 is heterogeneous in terms of dopant type relative to the Z-axis. The hetero-stacking of channel structures 215 and 217 in each of cell regions 205A and 205B is reflected in differences between layout diagrams 223 and 225. Because layout diagram 223 of FIG. 2C represents an upper level of layout diagram 201B of FIG. 2A, each of cell regions 205A and 205B is shown as having channel structure 217. By contrast, because layout diagram 225 of FIG. 2D represents a lower level of layout diagram 201B of FIG. 2A, each of cell regions 205A and 205B is shown as having channel structure 215.

In FIGS. 2C-2D, whereas each of cell regions 203A and 203B is heterogeneous in terms of dopant type relative to the Y-axis, nevertheless each of channel structures 207 and 209 in each of cell regions 203A and 203B is correspondingly homogeneous in terms of dopant type relative to the Z-axis. The homogeneity in terms of dopant type relative to the Y-axis of each of channel structures 207 and 209 in each of cell regions 203A and 203B is reflected as follows: the depiction of cell region 203A is the same in each of FIGS. 2C and 2D; and the depiction of cell region 203B is the same in each of FIGS. 2C and 2D.

Beyond layout diagram 201B, each of layout diagrams 223 and 225 further includes isolation dummy gates (IDGs) 229; cut-gate (CG) patterns 231 and via-to-gate (VG) contact structures 233.

Long axes of CG patterns 231 are parallel to the X-axis. In general, where a subject pattern underlies a given cut pattern such that a portion of the subject pattern is overlapped by the given cut pattern, the given cut pattern is used to indicate that the overlapped portion of the subject pattern eventually will be removed during fabrication of a corresponding semiconductor device. The subjects of CG patterns 231 are corresponding underlying portions of gate structures 227.

Relative to the Y-axis, an instance of CG shape 231 overlies upper ends of gate structures 227. As a result, the upper ends of gate structures 227 substantially align (relative to the Y-axis) with a first reference line (not shown). The first reference line is parallel and proximal to a top boundary of each of cell regions 203A-203B and 205A. Relative to a total number of upper ends, at least a majority of the total number of upper ends align with the first reference line. In some embodiments, the top boundary is substantially collinear with the midline of uppermost CG shape 231.

Relative to the Y-axis, an instance of CG shape 231 overlies lower ends of gate structures 227. As a result, the lower ends of gate structures 227 substantially align (relative to the Y-axis) with a second reference line (not shown). The second reference line is parallel and proximal to a bottom boundary of each of cell regions 203A-203B and 205B. Relative to a total number of lower ends, at least a majority of the total number of lower ends align with the second reference line. In some embodiments, the lower boundary is substantially collinear with the midline of lowermost CG shape 231.

In FIGS. 2C-2D, IDGs 229 replace gate structures 227 at left and right borders of each of cell regions 203A-203B and 205A-205B relative the X-axis. An isolation dummy gate, such as that created from an isolation dummy gate pattern (not shown), is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in a CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate. In some embodiments, IDGs 229 are replaced with gate structures 227. In some embodiments, gate structures 227 which replace IDGs 229 are designated for configuration as dummy date structures, e.g., by being left floating, by not being coupled to another electrical signal, or the like.

Beyond what is shown in layout diagram 201B, each of layout diagrams 223 and 225 further shows a distance 235 and a distance 237. Relative to the X-axis, distance 235 is between an instance of gate structure 227 and an immediately adjacent instance of IDG 235. Recalling that IDGs 229 replace corresponding instances of gate structures 227 in FIGS. 2C-2D, distance 235 has a value of approximately 1.0 CPP, where CPP is a unit of distance-measure. In some embodiments, CCP is an acronym for contacted poly pitch. A value for CPP is determined by the design rules and scale of the corresponding semiconductor process technology node.

Distance 237 represents a thickness of each of channel structures 207, 209, 215 and 217 relative to the Y-axis. In some embodiments, distance 237 is referred to as a width, NSH_w, of channel structures 207, 209, 215 and 217, where width is relative to the Y-axis. In some embodiments, in the text string "NSH_w," the text sub-string "NSH" is an acronym for nanosheet. In some embodiments, distance 235 has a value, NSH_w, in a range of $(\approx 10 \text{ nm}) \leq \text{NSH\_w} \leq (\approx 80 \text{ nm})$.

Figure 2E:
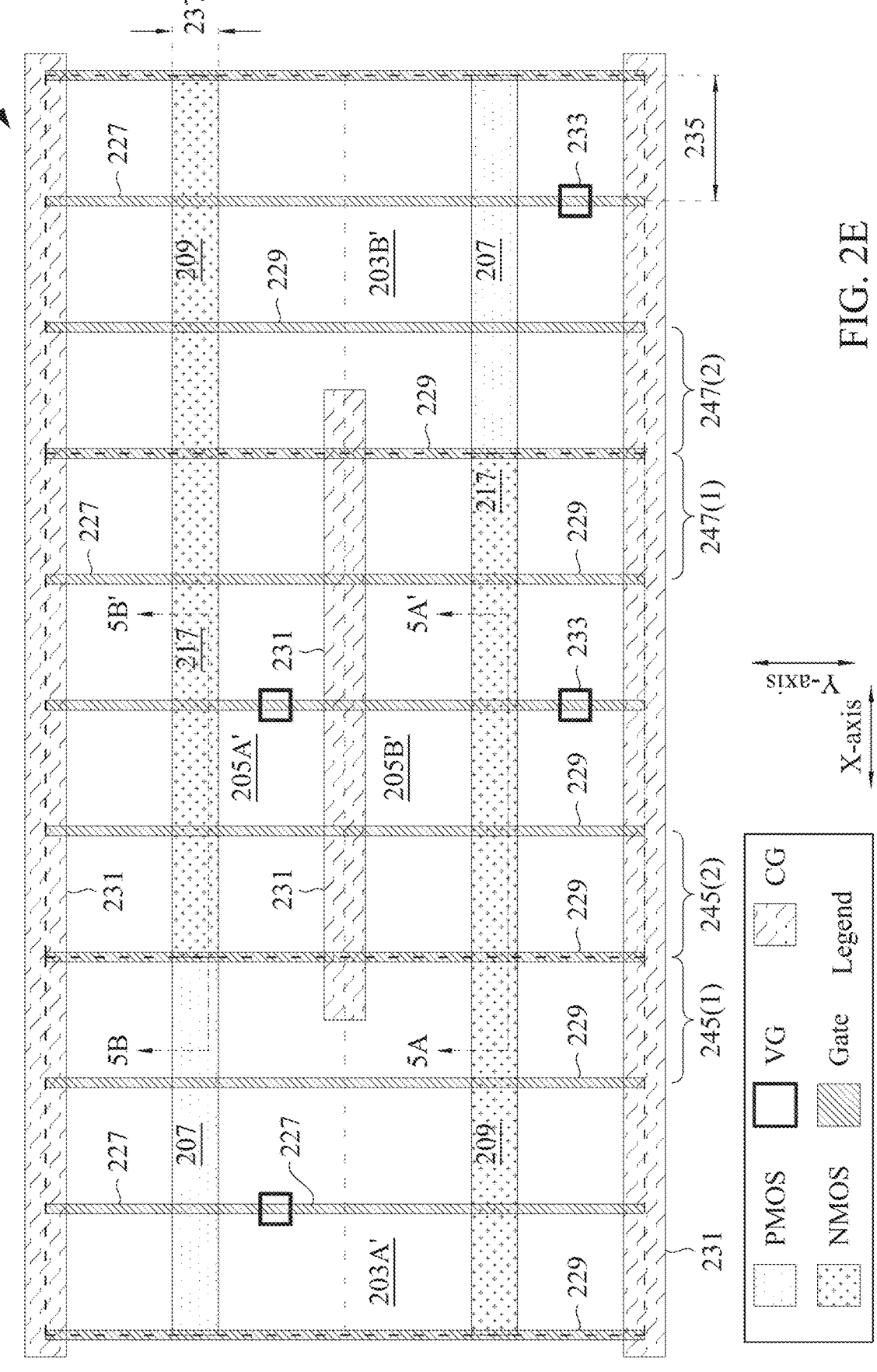
FIGS. 2E-2F are corresponding layout diagrams of a semiconductor device, in accordance with some embodiments.
Figure 2F:
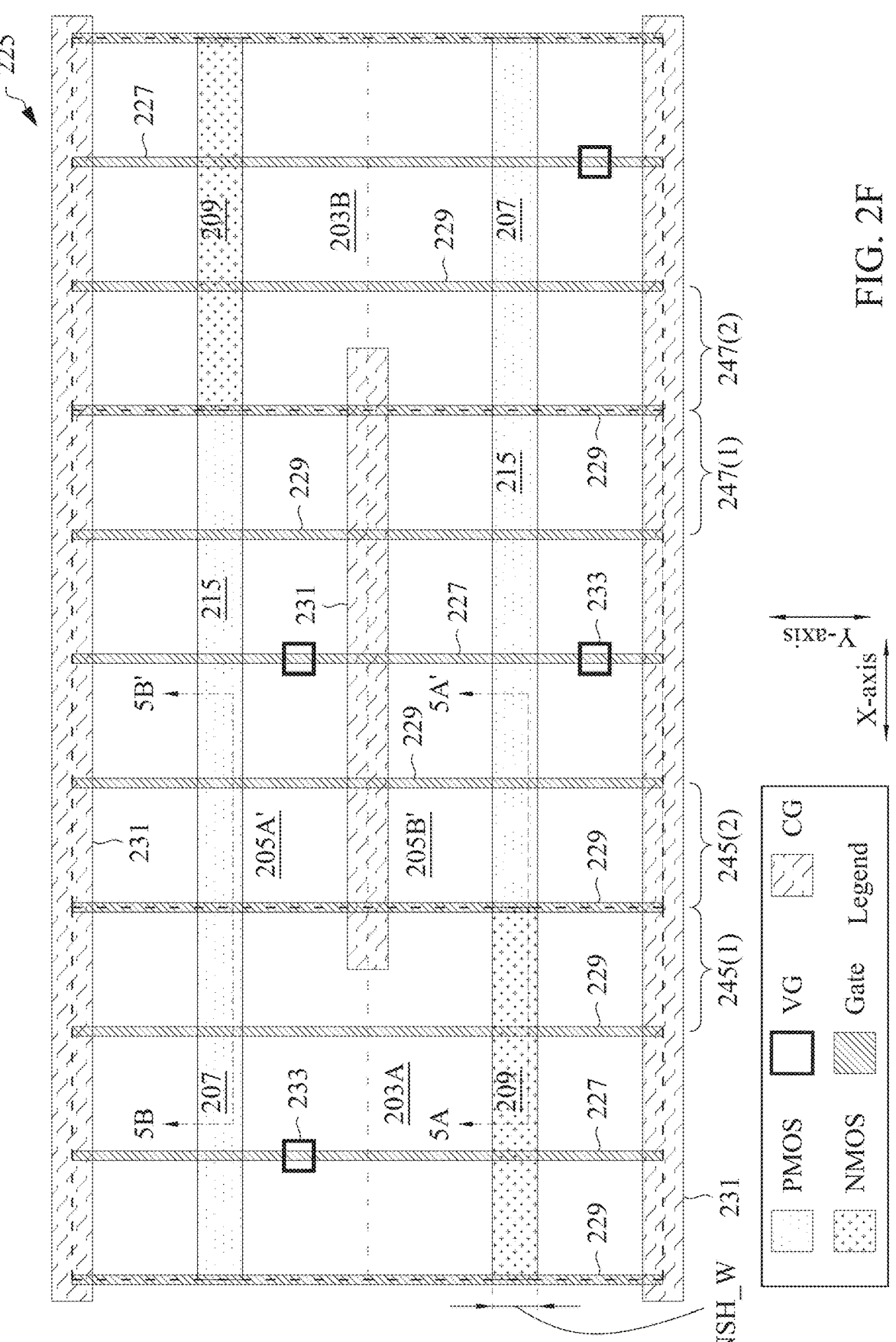

Layout diagrams 223 and 225 of corresponding FIGS. 2C-2D have smaller footprints, relative to the X-axis, than corresponding layout diagrams 223' and 225' of corresponding FIGS. 2E-2F. In some embodiments in which distance 235 represents a unit of 1 CPP, each of layout diagrams 223 and 225 of corresponding FIGS. 2C and 2D, has a width of 6 CPP, whereas each of layout diagrams 223' and 225' of corresponding FIGS. 2E and 2F has a width of 10 CPP.

FIGS. 2C-2D are examples of layout diagrams which assume that the corresponding semiconductor processing node uses a relatively higher resolution type of lithography, e.g., extreme ultraviolet (EUV) lithography, or the like. As compared to a relatively lower resolution type of lithography, an advantage of EUV lithography is that EUV lithography facilitates fabricating semiconductor devices with relatively smaller footprints relative to the X-axis. As compared to the relatively lower resolution type of lithography, a disadvantage of EUV lithography is that EUV lithography is relatively more expensive. By contrast, FIGS. 2E-2F are examples of layout diagrams which assume that a corresponding semiconductor processing node uses the relatively lower resolution type of lithography, e.g., a non-EUV lithography such as 193 nm immersion (193i) lithography, or the like. As compared to the relatively higher resolution type of lithography, an advantage of non-EUV lithography is that non-EUV lithography is relatively less expensive. As compared to the relatively higher resolution type of lithography, a disadvantage of non-EUV lithography is that non-EUV lithography facilitates fabricating semiconductor devices with relatively larger footprints relative to the X-axis in order to avoid layout-dependent effects (LDEs), or the like.

Because of the relatively higher resolution type of lithography, relative to the X-axis, in each of FIGS. 2C-2D, nearest instances of gate structures 227 are separated by a single instance of IDG 229.

FIGS. 2E-2F are corresponding layout diagrams 223' and 225' of semiconductor device, in accordance with some embodiments.

Together, layout diagrams 223' and 225' represent layout diagram 201B of FIG. 2A. More particularly, layout diagram 223' represents an upper level of layout diagram 201B whereas layout diagram 225' represents a lower level of layout diagram 201B. As such, together layout diagrams 223' and 225' are a representation of semiconductor device 201A, and thus represents a mixed-CMOS type of architecture. Section line 5A-5A' in each of FIGS. 2E-2F corresponds to FIG. 5A. Section line 5B-5B' in each of FIGS. 2E-2F corresponds to FIG. 5B.

FIGS. 2E-2F are similar to FIGS. 2C-2D. Accordingly, for purposes of brevity, the discussion of FIGS. 2E-2F will focus on differences between FIGS. 2E-2F with respect to FIGS. 2C-2D while minimizing discussion of similarities of FIGS. 2E-2F with respect to FIGS. 2C-2D.

FIGS. 2E-2F are examples of layout diagrams which assume that a corresponding semiconductor processing node uses the relatively lower resolution type of lithography, e.g., a non-EUV lithography such as 193 nm immersion (193i) lithography, or the like. By contrast, FIGS. 2C-2D are examples of layout diagrams which assume that the corresponding semiconductor processing node uses a relatively higher resolution type of lithography, e.g., extreme ultraviolet (EUV) lithography, or the like.

Layout diagrams 223' and 225' of corresponding FIGS. 2E-2F have larger footprints, relative to the X-axis, than corresponding layout diagrams 223 and 225 of corresponding FIGS. 2C-2D. In some embodiments in which distance 235 represents a unit of 1 CPP, each of layout diagrams 223' and 225' of corresponding FIGS. 2E and 2F has a width of 10 CPP whereas each of layout diagrams 223 and 225 of corresponding FIGS. 2C and 2D has a width of 6 CPP.

In FIGS. 2E and 2F, each of corresponding layout diagrams 223' and 225' is larger in width by an amount of 4 CPP as compared to layout diagrams 223 and 225 of corresponding FIGS. 2C and 2D. The extra 4 CPP in width in each of FIGS. 2E-2F is introduced to avoid LDEs, or the like, associated with the relatively lower resolution type of lithography assumed by FIGS. 2E-2F.

Because of the relatively lower resolution type of lithography assumed by FIGS. 2E-2F, relative to the X-axis, nearest instances of gate structures 227 are separated by three instances of IDG 229. By contrast, in each of FIGS. 2C-2D, nearest instances of gate structures 227 are separated by a single instance of IDG 229 because of the relatively higher resolution type of lithography assumed by FIGS. 2C-2D.

In FIGS. 2E-2F, the extra 4 CPP in width as compared to FIGS. 2C-2D is accounted for in each of FIGS. 2E-2F as follows: expansion 245(1) accounts for 1 CPP; expansion 245(2) accounts for 1 CPP; expansion 247(1) accounts for 1 CPP; and expansion 247(2) accounts for 1 CPP.

FIGS. 3A-3N are corresponding cross-sectional diagrams of a workpiece during a fabrication process, in accordance with some embodiments.

The fabrication process of FIG. 3A-3N produces a semiconductor device having a mixed-CMOS type of architecture. The fabrication process of FIG. 3A-3N produces a semiconductor device which is an example of semiconductor device 101 of FIG. 1.

In FIG. 3A, a workpiece 300 has been formed. Workpiece 300 includes channel-stacks 304(1), 304(2) and 304(3) formed on a substrate 302. Each of channel-stacks 304(1), 304(2) and 304(3) is separated from nearest ones of stack structures 363(1)-363(4) by corresponding ones of recess 322. In some embodiments, each of stack structures 363(1)-363(4) is an IDG. More particularly, relative to the X-axis: a left side of channel-stack 304(1) is separated from stack structure 363(1) by an instance of recess 322, and a right side of channel-stack 304(1) is separated from stack structure 363(2) by an instance of recess 322; a left side of channel-stack 304(2) is separated from stack structure 363(2) by an instance of recess 322, and a right side of channel-stack 304(2) is separated from stack structure 363(3) by an instance of recess 322; and a left side of channel-stack 304(3) is separated from stack structure 363(3) by an instance of recess 322, and a right side of channel-stack 304(3) is separated from stack structure 363(4) by an instance of recess 322.

Each of channel-stacks 304(1)-304(3) includes precursor-active (pre-A) layers 308 interspersed with first sacrificial (sac) layers 306 which are interleaved relative to the Z-axis. In some embodiments, each precursor-active layer 308 is a nanosheet.

In some embodiments, relative to the Z-axis, a distance 339 between immediately adjacent instances of precursor-active layers 308 is the pitch therebetween (precursor-active layer pitch), which is the same as the pitch between active layers 3080 (FIG. 3J) (active layer pitch). In some embodiments, pitch 339 has a value, NSH_p, in a range of ($\approx 15$ nm)$\le$NSH_P$\le$($\approx 25$ nm).

In each of channel-stacks 304(1)-304(3), one of precursor-active layers 308 has been replaced with an isolation boundary layer 309 above which is a predetermined number of sacrificial layers 306 representing some but not all thereof. In FIGS. 3A-3N, in each of channel-stacks 304(1)-304(3), there are two instances of sacrificial layer 306 above isolation boundary layer 309, and two instances of sacrificial layer 306 below isolation boundary layer 309. Accordingly, each of channel-stacks 304(1)-304(3) includes four instances of precursor-active layer 308. In some embodiments, one or more instances of precursor-active layer 308 are formed above isolation boundary layer 309. In some embodiments, one or more instances of precursor-active layer 308 are formed below isolation boundary layer 309.

In some embodiments, precursor-active layers 308 and sacrificial layers 306 have different semiconductor compositions. In some embodiments, precursor-active layers 308 are formed of silicon (Si) and sacrificial layers 306 are formed of silicon germanium (SiGe). In such embodiments, the additional germanium content in sacrificial layers 306 facilitates selective removal or recess of sacrificial layers 306 without substantial damage to precursor-active layers 308. In some embodiments, precursor-active layers 308 include germanium (Ge), silicon germanium (SiGe), or a two-dimensional (2D) material such as molybdenum disulfide (MoS2), tungsten diselenide (WSe2), or hafnium ditelluride (HfTe2). In some embodiments where precursor-active layers 308 and sacrificial layers 306 are formed of silicon germanium (SiGe), precursor-active layers 308 have a smaller germanium content than sacrificial layers 306 to allow selective recess/removal of sacrificial layers 306. In some embodiments, sacrificial layers 306 and precursor-active layers 308 are epitaxy layers which are deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. As shown in FIG. 3A, sacrificial layers 306 and precursor-active layers 308 are deposited alternatingly, one-after-another, to form corresponding channel-stacks 304(1)-304(3).

Each of channel-stacks 304(1)-304(3) further includes a dummy gate-head (GH) structure (318) over an uppermost one of precursor-active layers 308. In some embodiments, dummy GH structures are formed of polysilicon.

Each of channel-stacks 304(1)-304(3) further includes inner spacer features 326 which are formed in recesses 324 in sacrificial layers 306.

The recesses in sacrificial layers 306 are formed by a selective recessing process which is selective for the exposed sidewalls of sacrificial layers 306 but is substantially not selective for the exposed sidewalls of precursor-active layers 308, i.e., the exposed sidewalls of precursor-active layers 308 are substantially unaffected by the selective recessing process. In some embodiments, the selective recessing process includes a SiGe oxidation process followed by a SiGe oxide removal. In such embodiments, the SiGe oxidation process includes, e.g., use of ozone (O3). In some embodiments, the selective recessing process is a selective isotropic etching process (e.g., a selective dry etching process or a selective wet etching process), and the extent to which sacrificial layers 306 are recessed is controlled by a duration of the etching process. In some embodiments, the selective dry etching process includes, e.g., use of one or more fluorine-based etchants, such as fluorine gas or hydrofluorocarbons. In some embodiments, the selective wet etching process includes, e.g., an APM etch (e.g., ammonia hydroxide-hydrogen peroxide-water mixture).

Regarding FIG. 3A, after the formation of the inner spacer recesses, inner spacer spacer features 326 are formed by depositing an inner spacer material layer over workpiece 300 including in the inner spacer recesses. In some embodiments, the formation of inner spacer spacer features 326 includes one or more iterations of a silicon oxycarbonitride (SiOCN) deposition process. In some embodiments, plasma-enhanced atomic layer deposition (PEALD) processes are used to deposit SiOCN films. In some emodiments, the inner spacer material layer includes silicon oxide, silicon nitride, silicon oxycarbide, silicon carbonitride, metal nitride, or a suitable dielectric material. The deposited inner spacer material layer is then etched back to remove excess inner spacer material layer on gate spacer 320 and on sidewalls of precursor-active (pre-A) layers 308, thereby resulting in inner spacer features 326 as shown in FIG. 3A. In some embodiments, the etch back process is a dry etch process that includes use of an oxygen-containing gas, hydrogen, nitrogen, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBr3), an iodine-containing gas (e.g., CF3I), other suitable gases and/or plasmas, and/or combinations thereof.

In FIG. 3B, for each of channel-stacks 304(1), 304(2) and 304(3), each of corresponding recesses 322 has been filled with a dielectric plug 341. In some embodiments, dielectric plugs 341 are formed using a shallow trench isolation (STI) process. In some embodiments, a dielectric material is deposited in each s recess 322 using chemical vapor deposition (CVD), sub-atmospheric CVD (SACVD), flowable CVD, atomic layer deposition (ALD), physical vapor deposition (PVD), or the like. Then the deposited dielectric material is planarized to match a thickness of dummy GH structure 318. In some embodiments, the dielectric material for dielectric plugs 341 includes silicon oxide, silicon oxynitride, fluorine-doped silicate glass (FSG), a low-k dielectric, combinations thereof, and/or other suitable materials.

In FIG. 3C, hard masks PR1 are deposited: over dielectric plugs 341 of recesses 322 of channel-stack 304(1) as well as over channel-stack 304(1) itself; and over dielectric plugs 341 in recesses 322 of channel-stack 304(3) as well as over channel-stack 304(3) itself.

More particularly, hard masks PR1 are deposited over workpiece 300. In some embodiments, the deposition of hard masks PR1 includes use of low-pressure CVD (LPCVD), CVD, plasma-enhanced CVD (PECVD), PVD, ALD, thermal oxidation, e-beam evaporation, or other suitable deposition techniques, or combinations thereof. In some embodiments, hard masks PR1 are multi-layer and include silicon oxide and silicon nitride. Using photolithography and etching processes, hard masks PR1 are patterned. In some embodiments, the photolithography process includes photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process includes dry etching (e.g., RIE etching), wet etching, and/or other etching methods. Thereafter, using hard masks PR1 as etch masks, exposed dielectric plugs 341 in recesses 322 of channel-stack 304(2) are etched to remove some but not all of the dielectric material, resulting in partial dielectric plugs 343 in each partially-filled recess 322' of channel-stack 304(2). Relative the Z-axis, partial dielectric plugs 343 rise in each partially-filled recess 322' of channel-stack 304(2) to a level of isolation boundary layer 309.

In FIG. 3D, hard masks PR1 are removed. Then, hard masks PR2 are deposited: over partial dielectric plugs 343 so as to fill recesses 322' of channel-stack 304(2) as well as over channel-stack 304(2) itself, and over dielectric plugs 341 in recesses 322 of channel-stack 304(3) as well as over channel-stack 304(3) itself. The deposition of hard masks PR2 in FIG. 3D uses processes similar to the deposition of hard masks PR1 in FIG. 3C.

In FIG. 3E, hard masks PR2 are removed. Then, growth-inhibiting (GI) liners 365 and 367 are formed. More particularly, GI liner 365 is formed in each recess 322 of channel-stack 304(1) against exposed sidewalls of precursor active layers 308 and gate spacers 320. GI liner 367 is formed in each recess 322 of channel-stack 304(2) against exposed sidewalls of precursor active layers 308 and gate spacers 320. Because of partial dielectric plugs 343 in each recess 322 of channel-stack 304(2), GI liner 367 extends down into each recess 322 of channel-stack 304(2) to a level of isolation boundary layer 309.

In some embodiments, GI liners 365 and 367 are formed of silicon nitride (SiN). In some embodiments, GI liners 365 and 367 are formed of a low-K dielectric material other than SiN such as SiO2, SiCN, SiOC, or the like. In some embodiments, GI liners 365 and 367 are formed of a high-K dielectric material such as titanium oxide (TiO2), hafnium zirconium oxide (HfZrO), tantalum oxide (Ta2O5), hafnium silicon oxide (HfSiO4), zirconium oxide (ZrO2), zirconium silicon oxide (ZrSiO2), lanthanum oxide (La2O3), aluminum oxide (Al2O3), zirconium oxide (ZrO), yttrium oxide (Y2O3), SrTiO3 (STO), BaTiO3 (BTO), Ba7rO, hafnium lanthanum oxide (HfLaO), lanthanum silicon oxide (La-SiO), aluminum silicon oxide (AlSiO), hafnium tantalum oxide (HMO), hafnium titanium oxide (HfTiO), (Ba,Sr)TiO3 (BST), silicon oxynitride (SiON), combinations thereof, or other suitable material. In some embodiments, GI liners 365 and 367 may have a thickness ranging from about 1 nm to about 6 nm.

In FIG. 3F, partial dielectric plug 343 in each recess 322 of channel-stack 304(2) and dielectric plug 341 in each recess 322 of channel-stack 304(3) are removed, e.g., by etching. In some embodiments, the etch process is a dry etch process or a suitable etch process. An example dry etch process uses an oxygen-containing gas, hydrogen, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBr3), an iodine-containing gas, other suitable gases and/or plasmas, and/or combinations thereof.

In FIG. 3G, source/drain (S/D) features 328(1) and 328(2) having a first type of doping, e.g., P-type, are formed. More particularly, S/D feature 328(1) is formed in each recess 322 of channel-stack 304(2), and S/D feature 328(2) is formed in each recess 322 of channel-stack 304(3).

Because of GI liner 365 extends down to substrate 302, no S/D feature is formed in each recess 322 of channel-stack 304(1). Because GI liner 367 extends down into each recess 322 of channel-stack 304(2) only to the level of isolation boundary layer 309, S/D feature 328(1) is formed below the level of isolation boundary layer 309 in each recess 322 of channel-stack 304(2) with a result that a portion remains of each recess 322 of channel-stack 304(2). Relative to the Z-axis, an upper surface of S/D features 328(2) is controlled to be at substantially the same height as the upper surface of the uppermost one of precursor active layers 308. Because channel-stack 304(3) lacks a GI liner in each recess 322 thereof, S/D feature 328(2) is formed in each recess 322 of channel-stack 304(2).

In some embodiments, S/D features 328(1) and 328(2) are formed using an epitaxial process, such as VPE, UHV-CVD, MBE, and/or other suitable processes. In some embodiments, the epitaxial growth process uses gaseous and/or liquid precursors, which interact with substrate 302 as well as precursor-active layers 308. In some embodiments, S/D features 328(1) and 328(2) include one or more layers of Si, SiGe, Ge, or the like. In some embodiments, S/D features 328(3) and 328(4) include p-type dopants, such as boron (B). In some embodiments, the P-type dopant is in-situ doped during the epitaxial process by introducing a P-type dopant. In some embodiments, the P-type dopant is ex-situ doped using an implantation process (e.g., a junction implant process), or the like.

In FIG. 3G, after S/D features 328(1) and 328(2) are formed, dielectric plugs 369 are correspondingly formed on S/D features 328(1) in each recess 322 of channel-stack 304(2). Relative the Z-axis, dielectric plugs 369 are at substantially the same level as, and have substantially the same thickness as, isolation boundary layer 309. Dielectric plugs 369 electrically isolate S/D feature 328(1) from corresponding S/D features 328(4) (FIG. 3I).

In some embodiments, dielectric plugs 369 include silicon oxide, silicon nitride, silicon oxynitride (SiON), SiOCN, SiCN, fluorine-doped silicate glass (FSG), a low-K dielectric material, or any suitable dielectric material. In some embodiments, dielectric plugs 369 are formed by any suitable method, such as low-pressure chemical vapor deposition (LPCVD), plasma enhanced CVD (PECVD) or flowable CVD (FCVD). In some embodiments, dielectric plugs 369 include an oxide that is formed by flowable CVD (FCVD).

In FIG. 3H, liners 365 and 367 are removed. In some embodiments, GI liners 365 and 367 are removed using one or more suitable selective etch processes, such as dry etch, wet etch, or a combination thereof. Such etching processes are selective for GI liners 365 and 367 but are substantially not selective for dielectric plugs 369, i.e., dielectric plugs 369 are substantially unaffected by such etching processes.

In FIG. 3I, S/D features 328(3) and 328(4) having a second type of doping, e.g., N-type, are formed. More particularly, S/D feature 328(3) is formed in each recess 322 of channel-stack 304(1), and S/D feature 328(4) is formed in the remaining portion of each recess 322 of channel-stack 304(2).

Because channel-stack 304(1) lacks a GI liner in each recess 322 thereof, S/D feature 328(3) is formed in each recess 322 of channel-stack 304(2). Because channel-stack 304(2) lacks a GI liner in the remaining portion of each recess 322 thereof, S/D feature 328(4) is formed in the remaining portion of each recess 322 of channel-stack 304(2). Relative to the Z-axis, each S/D feature 328(4) extends down into each recess 322 of channel-stack 304(2) only to the level of the upper surface corresponding dielectric plug 369. Relative to the Z-axis, upper surfaces of S/D features 328(3) and 328(4) are controlled to be at substantially the same height as the upper surface of the uppermost one of precursor active layers 308 correspondingly in channel-stacks 304(1) and 304(2). Recesses 322 remain above each of S/D regions 328((2), 328(3) and 328(4) between corresponding dummy GH structures 318.

Regarding FIG. 3I, in some embodiments, S/D features 328(1) and 328(2) are formed using an epitaxial process, such as VPE, UHV-CVD, MBE, and/or other suitable processes. In some embodiments, the epitaxial growth process uses gaseous and/or liquid precursors, which interact with substrate 302 as well as precursor-active layers 308. In some embodiments, S/D features 328(1) and 328(2) include one or more layers of Si, SiP, SiC, Si, SiC, GaAs, GaAsP, SiP, SiCP, or the like. In some embodiments, the N-type dopant is in-situ doped during the epitaxial process by introducing an N-type dopant. In some embodiments, the N-type dopant is ex-situ doped using an implantation process (e.g., a junction implant process), or the like.

Regarding FIG. 3I, in some embodiments, each of S/D features 328(2) and 328(3) has a height H1 in a range $$(\approx(4*NSH\_p+th\_369)){\leq}H1{\leq}(\approx(6*NSH\_p+th\_369)),$$

where NSH_p is pitch 339 and th_369 is the thickness of dielectric plug 369 relative to the Z-axis. In some embodiments, th_369 has a range of values $(\approx3\ nm){\leq}th\_369{\leq}(\approx13\ nm)$.

Regarding FIG. 3I, in some embodiments, field-effect transistors (FETs) of different dopant type but substantially similar dimensions have different current-conducting capabilities. In some embodiments, N-type FETs (NFETs) have greater current-conducting capabilities than P-type FETs (PFETs) of substantially similar dimensions. In some embodiments, to achieve substantially PFETs with similar current-conducting capabilities as NFETs, a height H2 of S/D features 328(1) is greater than a height of H3 of S/D features 328(4). In some embodiments in which H3<H2, each of S/D features 328(4) has a height H3 in a range $$(\approx2*NSH\_p){\leq}H3{\leq}(\approx3*NSH\_p+th),$$

whereas each of S/D features 328(1) has a height H2 in a range $$(\approx2.5*NSH\_p){\leq}H2{\leq}(\approx4*NSH\_p+th).$$

In FIG. 3J, each dummy GH structure 318 has been removed, each sacrificial layer 306 has been removed and each dielectric plug 369 has been removed. The removal of dielectric plugs 369 results in corresponding voids 371 that are filed only with the gas of the ambient atmosphere, which functions as a dielectric.

In some embodiments, the transition from FIG. 3I to FIG. 3J is as follows: a first contact etch stop layer (CESL) (not shown) is deposited, then first interlayer dielectric (ILD) structures 373 are deposited, then dummy GH structures 318 are removed, then sacrificial layers 306 are selectively removed to release precursor-active layers 308 as active layers 3080, and then dielectric plugs 369 are removed. In some embodiments, dielectric plugs 369 are removed and then sacrificial layers 306 are selectively removed to release precursor-active layers 308 as active layers 3080.

In some embodiments, the first CESL includes silicon nitride, silicon oxynitride, and/or other suitable materials. In some embodiments, the first CESL is formed by ALD, plasma-enhanced chemical vapor deposition (PECVD) process and/or other suitable deposition or oxidation processes. In some embodiments, the first CESL is deposited on top surfaces of S/D features 328(2), 328(3) and 328(4). Thereafter, first ILD structures 373 are deposited over the first CESL. In some embodiments, the material of first ILD structures 373 includes tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, first ILD structures 373 are deposited by a PECVD process or other suitable deposition technique. In some embodiments, after formation of first ILD structures 373, workpiece 300 is annealed to improve integrity of first ILD structures 373. In some embodiments, to remove excess materials and to expose top surfaces of channel-stacks 304(1), 304(2) and 304(3), a planarization process, such a chemical mechanical polishing (CMP) process is performed.

Regarding FIG. 3J, in some embodiments, dummy GH structures 318 are removed by etching. In some embodiments, the etch process is a dry etch process or a suitable etch process. An example dry etch process uses an oxygen-containing gas, hydrogen, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBr3), an iodine-containing gas, other suitable gases and/or plasmas, and/or combinations thereof.

In some embodiments, the selective removal of sacrificial layers 306 includes one or more etching processes that are selective to the material in sacrificial layers 306. In some embodiments, the selective etching process is a selective wet etch, a selective dry etch, or a combination thereof. After the removal of sacrificial layers 306 releases precursor-active layers 308 as active layers 3080, upper and lower surfaces of active layers 3080 in each of channel-stacks 304(1), 304(2) and 304(3) are exposed. In some embodiments, the selective wet etching includes an APM etch (e.g., ammonia hydroxide-hydrogen peroxide-water mixture). In some embodiments, the selective removal includes SiGe oxidation followed by a silicon germanium oxide removal; in such embodiments, for example, the oxidation is provided by ozone clean and then silicon germanium oxide is removed by an etchant such as NH4OH, or the like.

In FIG. 3K, gate layers 3060 are formed correspondingly in the voids left by the removal of sacrificial layers 306, and a gate-head (GH) structure 338 is formed over each of channel-stacks 304(1), 304(2) and 304(3). More particularly, GH structure 338 and gate layers 3060 are deposited to wrap around each of active layers 3080 in each of channel-stacks 304(1), 304(2) and 304(3).

In some embodiments, the transition from FIG. 3J to FIG. 3K is as follows. A first gate dielectric layer (not shown) is deposited and then GH structure 338 and gate layers 3060 are deposited. In some embodiments, the first gate dielectric layer includes an interfacial layer (not shown) and a high-k dielectric layer (not shown). Here, a high-k dielectric layer refers to a layer formed of a dielectric material having a dielectric constant greater than that of silicon dioxide (SiO2), which is about 3.9. In some embodiments, the interfacial layer includes silicon oxide; in some embodiments, the interfacial layer is formed in a pre-clean process. In some embodiments, the pre-clean process includes use of RCA SC-1 (ammonia, hydrogen peroxide and water) and/or RCA SC-2 (hydrochloric acid, hydrogen peroxide and water), or the like. The high-k dielectric layer is then deposited over the interfacial layer using, e.g., ALD, CVD, and/or other suitable methods. In some embodiments, the high-k dielectric layer includes hafnium oxide. Alternatively, in some embodiments, the high-k dielectric layer includes other high-K dielectrics, such as titanium oxide (TiO2), hafnium zirconium oxide (HfZrO), tantalum oxide (Ta2O5), hafnium silicon oxide (HfSiO4), zirconium oxide (ZrO2), zirconium silicon oxide (ZrSiO2), lanthanum oxide (La2O3), aluminum oxide (Al2O3), zirconium oxide (ZrO), yttrium oxide (Y2O3), SrTiO3 (STO), BaTiO3 (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), (Ba,Sr)TiO3 (BST), silicon nitride (SiN), silicon oxynitride (SiON), combinations thereof, or other suitable material.

Regarding FIG. 3K, in some embodiments, GH structure 338 is deposited over the first gate dielectric layer using ALD, PVD, CVD, e-beam evaporation, or other suitable methods. In some embodiments, GH structure 338 includes a single layer or alternatively a multi-layer structure. In some embodiments, a multi-layer arrangement of GH structure 338 includes various combinations of a metal layer with a selected work function to enhance the device performance (work function metal layer), a liner layer, a wetting layer, an adhesion layer, a metal alloy or a metal silicide. In some embodiments, GH structure 338 includes titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Recalling that FIG. 3K corresponds to section line 3K-3K' of FIG. 2A, channel stack-304(1) and corresponding GH structure 338 and active layers 3080 represent core components of an NFET 375N. As such, NFET 375N is an example of the NFET included in cell region 203A of FIG. 2A. Channel stack-304(2) and corresponding GH structure 338 and active layers 3080 represent core components of a CFET 305. As such, CFET 305 is an example of the CFET in cell region 205A of FIG. 2A. Channel stack-304(3) and corresponding GH structure 338 and active layers 3080 represent core components of a PFET 375P. As such, PFET 375P is an example of the PFET included in cell region 203B of FIG. 2A.

In FIG. 3K, each of channel-stacks 304(1)-304(3) includes four instances of active layer 3080. Accordingly, NFET 375N is a 4-nanosheet NFET and PFET 375P is a 4-nanosheet PFET. Also, CFET 305 is a 4-nanosheet CFET which represents a 2-nanosheet NFET stacked on a 2-nanosheet PFET. In some embodiments, each of channel-stacks 304(1)-304(3) includes a number of instances of active layer 3080 other than four. In some embodiments, a variable X1 representing the number of instances of active layers 3080 in the NFET of CFET 305 and a variable X2 representing the number of instances of active layers 3080 in the PFET of CFET 305 relate to a variable X3 representing the number of instances of active layers 3080 in each of NFET 375N and PFET 375P as follows, $$X3=X1+X2,$$

where each of X1, X2 and X3 is a positive integer. In FIG. 3K, X1=2 and X2=2 such that X3=4. In some embodiments, X1, X2 and X3 relate as follows, $$X1=X2=(X3)/2,$$

where each of X1, X2 and X3 is a positive integer. In FIG. 3K, X3=4 such that X1=X2=4/2=2.

Recalling that FIGS. 3L, 3M and 3N correspond to section lines 3L-3L', 3M-3M' and 3N-3N' in FIG. 2A, it is to be understood that the sectional view of each of FIGS. 3L, 3M and 3N each is rotated ninety degrees about the Z-axis with respect to the view of FIG. 3K. Each of FIGS. 3L-3N includes an instance of a gate structure 327, where gate structure 327 corresponds to gate structure 227 of FIG. 2A. FIG. 3L includes channel-stacks 304(1) and 304(4). FIG. 3M includes channel-stacks 304(2) and 304(5). FIG. 3N includes channel-stacks 304(3) and 304(6).

Figure 4A:
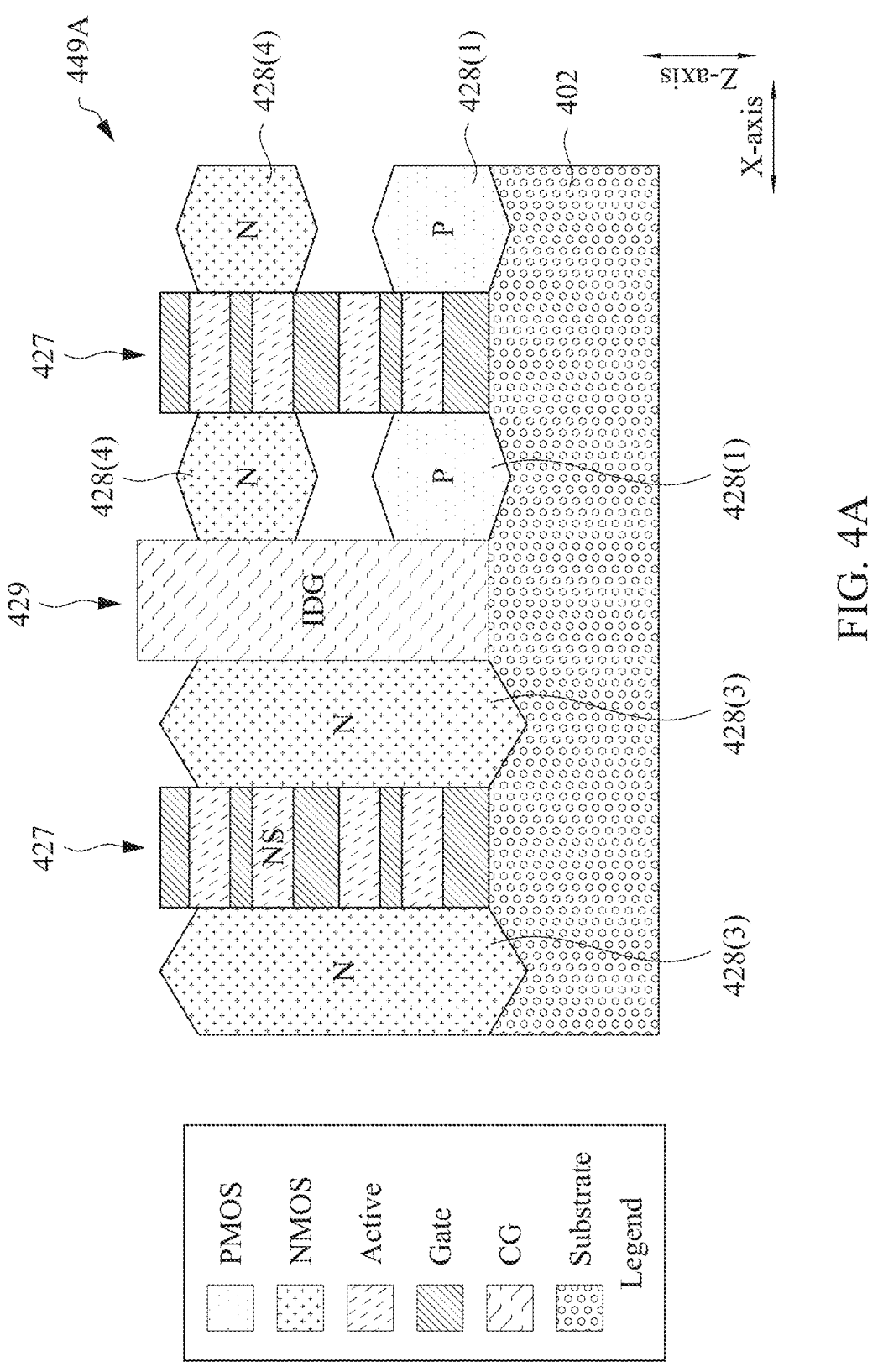
FIGS. 4A-4B are corresponding cross-sectional diagrams of a semiconductor device, in accordance with some embodiments.
Figure 4B:
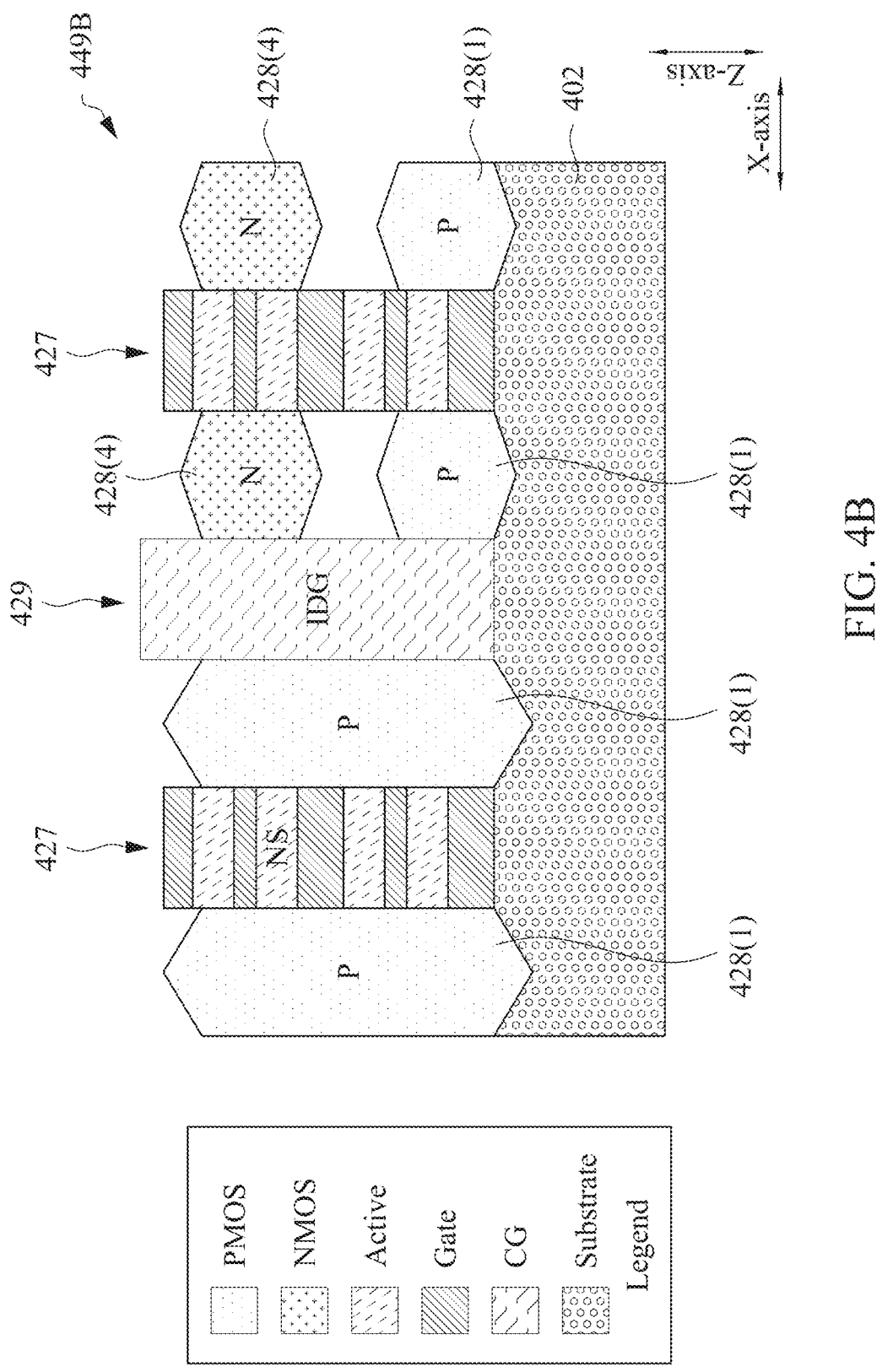

FIGS. 4A-4B are corresponding cross-sectional diagrams 449A and 449B of a semiconductor device, in accordance with some embodiments.

The semiconductor device of FIGS. 4A-4B is an example of the semiconductor device represented by layout diagrams 223 and 225 of corresponding FIGS. 2C-2D. FIG. 4A corresponds to section line 4A-4A' in each of FIGS. 2C-2D. FIG. 4B corresponds to section line 4B-4B' in each of FIGS. 2C-2D.

Each of cross-sectional diagrams 449A-449B includes: a semiconductor substrate 402; gate structures 427; an IDG 429; and S/D features 428(1) and 428(4). Cross-sectional diagram 449A further includes S/D features 428(3).

Figure 5A:
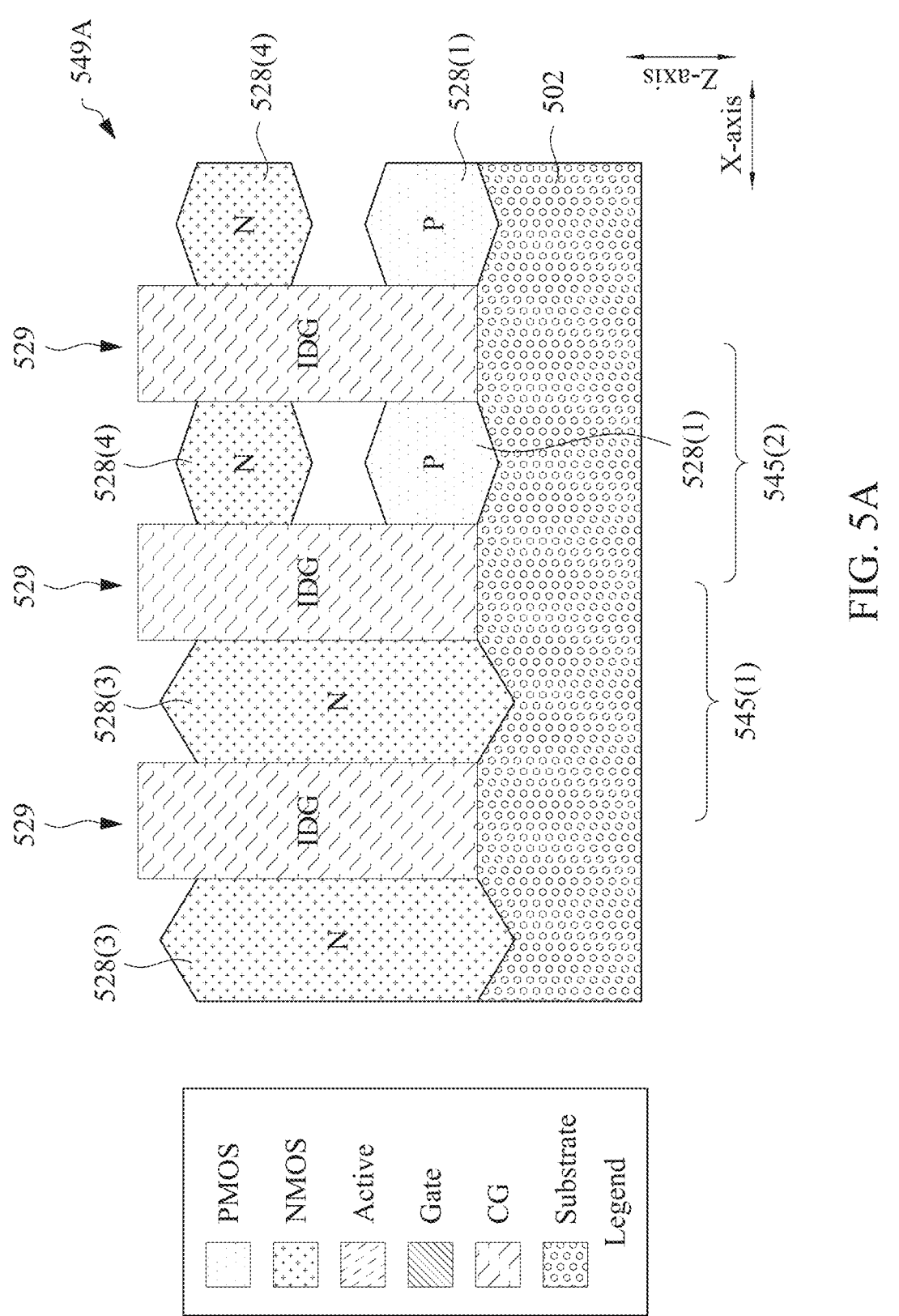
FIGS. 5A-5B are corresponding cross-sectional diagrams of a semiconductor device, in accordance with some embodiments.
Figure 5B:
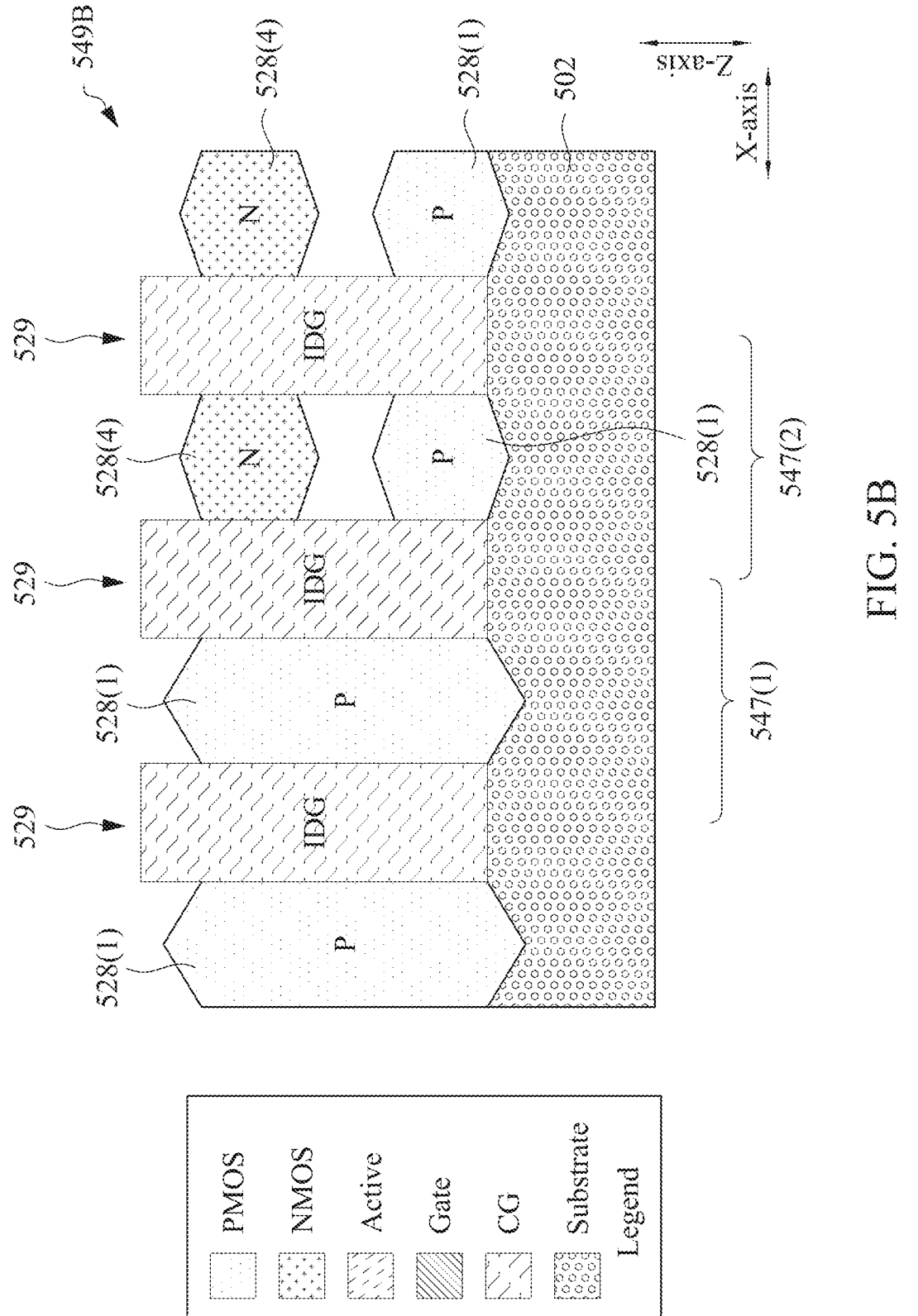

FIGS. 5A-5B are corresponding cross-sectional diagrams 549A and 549B of a semiconductor device, in accordance with some embodiments.

The semiconductor device of FIGS. 5A-5B is an example of the semiconductor device represented by layout diagrams 223' and 225' of corresponding FIGS. 2E-2F. FIG. 5A corresponds to section line 5A-5A' in each of FIGS. 2E-2F. FIG. 5B corresponds to section line 5B-5B' in each of FIGS. 2E-2F.

Each of cross-sectional diagrams 549A-549B includes: a semiconductor substrate 502; IDGs 529; and S/D features 528(1) and 528(4). Cross-sectional diagram 549A further includes S/D features 528(3).

In FIGS. 5A-5B, the extra 4 CPP in width as compared to FIGS. 4A-4B is accounted for in each of FIGS. 5A-5B as follows: expansion 545(1) accounts for 1 CPP; expansion 545(2) accounts for 1 CPP; expansion 547(1) accounts for 1 CPP; and expansion 547(2) accounts for 1 CPP.

Figure 6A:
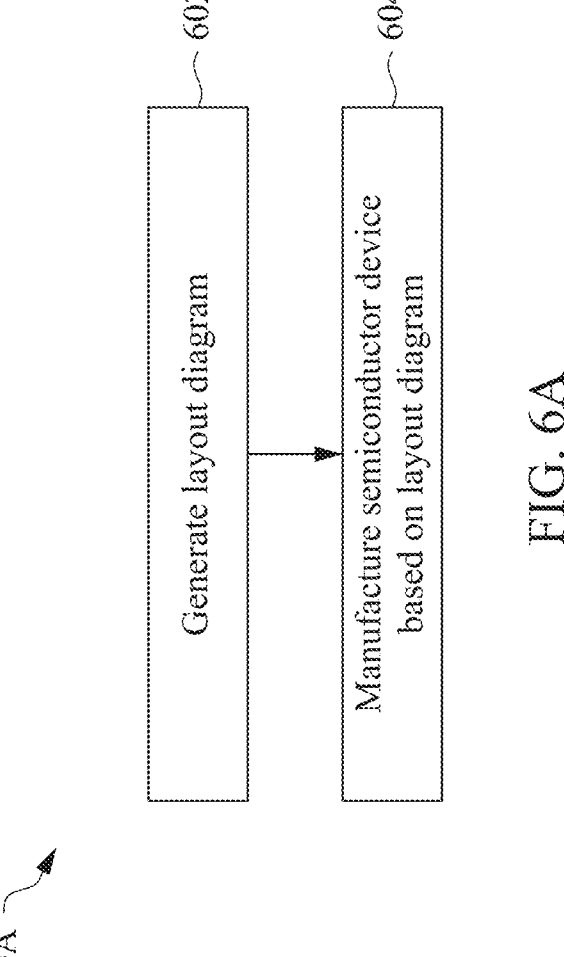
FIG. 6A is a flow diagram of a method of manufacturing a semiconductor device, in accordance with some embodiments.

FIG. 6A is a flow diagram 600A of a method of manufacturing a semiconductor device, in accordance with some embodiments.

The method of flowchart 600A is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flowchart 600A include the semiconductor device of FIG. 1, semiconductor devices based on FIG. 2A, semiconductor devices based on the layout diagrams disclosed herein, semiconductor devices based on the cross-sectional diagrams disclosed herein, or the like.

In FIG. 6A, the method of flowchart 600A includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 800 in FIG. 8 below.

Figure 6B:
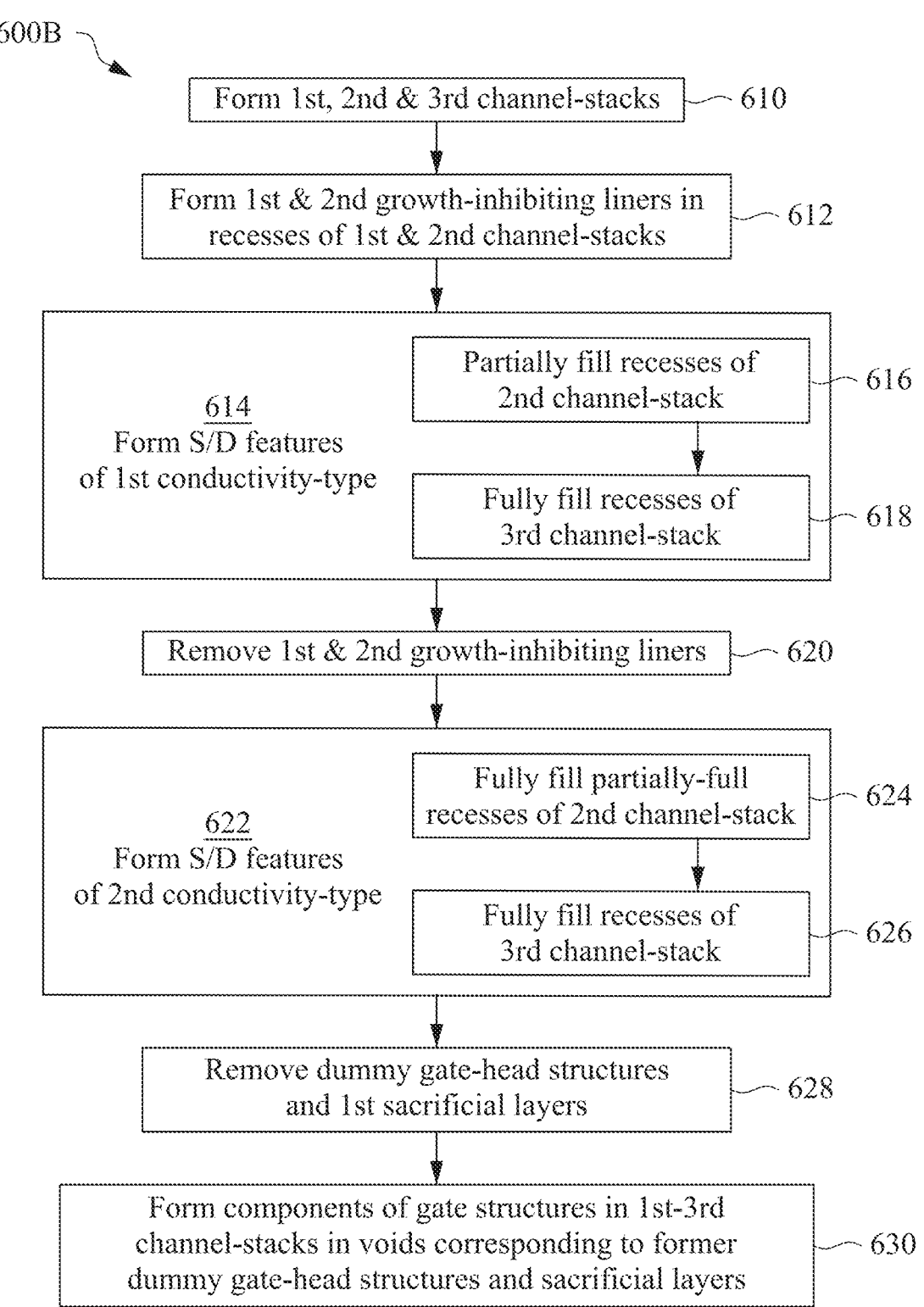
FIG. 6B is a method of fabricating a semiconductor device, in accordance with some embodiments.

FIG. 6B is a method 600B of fabricating a semiconductor device, in accordance with some embodiments.

The method 600B of flowchart is implementable, for example, using IC manufacturing system 800 (FIG. 8, discussed below), in accordance with some embodiments. Examples of a semiconductor device which can be manufactured according to the method 600B of flowchart include semiconductor device 101 of FIG. 1, semiconductor devices based on FIG. 2A, semiconductor devices based on the layout diagrams disclosed herein, semiconductor devices based on the cross-sectional diagrams disclosed herein, or the like. or the like.

Method 600B includes blocks 610-630. At block 610, first, second and third channel-stacks are formed on a substrate. An example of the substrate is substrate 302 of FIG. 3A, or the like. Examples of the first, second and third channel-stacks include corresponding channel-stacks 304 (1), 304(2) and 304(3) of FIG. 3A, or the like. From block 610, flow proceeds to block 612.

Regarding block 610, in some embodiments, each of the first, second and third channel-stacks includes precursor-active layers and first sacrificial layers which are interleaved relative to a first direction, e.g., the Z-axis. Examples of the precursor-active layers include precursor-active (pre-A) layers 308 in FIG. 3A, or the like. Examples of the first sacrificial layers include sacrificial layers 306 in FIG. 3A, or the like.

Regarding block 610, in some embodiments, each of the first, second and third channel-stacks is separated on first and second sides, relative to a second direction (e.g., the X-axis) perpendicular to the first direction (again, the Z-axis), from nearest other structures by corresponding first and second recesses. Examples of the first and second recesses include recesses 322 to the left and right sides of each of channel-stacks 304(1), 304(2) and 304(3) of FIG. 3A relative to the X-axis, or the like. Examples of the nearest other structures corresponding to the first, second and third channel-stacks include stack structures 363(1)-363(4) in FIG. 3A. In some embodiments, each of stack structures 363(1)-363(4) is an IDG.

Regarding block 610, in some embodiments, in each of the first, second and third channel-stacks, one of the precursor-active layers has been replaced with an isolation boundary layer above which is a predetermined number of the first sacrificial layers, the predetermined number representing some but not all of the first sacrificial layers. An example of the isolation boundary layer is isolation boundary layer 309 in FIG. 3A, or the like.

Regarding block 610, in some embodiments, in each of the first and second recesses of each of the first, second and third channel-stacks, inner spacers are formed against sidewalls of the first sacrificial layers of the first, second and third channel-stacks. Examples of the inner spacers are inner spacer spacer features 326 which are formed in corresponding recesses 324 in each of channel-stacks 304(1), 304(2) and 304(3) of FIG. 3A, or the like. In some embodiments, after the inner spacers are formed, each of the first and second recesses (e.g., 322) of each of the first (e.g., 304(1)), second (e.g., 304(2)) and third (e.g., 304(3)) channel-stacks is filled with an insulating material (e.g., 341); see the discussion of FIG. 3B.

Regarding block 610, in some embodiments, each of the first, second and third channel-stacks further includes a dummy gate-head (GH) structure over an uppermost one of precursor-active layers. Examples of the dummy GH structures are dummy GH structures 318 in FIG. 3A, or the like.

At block 612, first and second growth-inhibiting liners are selectively formed against sidewalls of the inner spacers and sidewalls of the precursor-active layers correspondingly of each of the first and second channel-stacks. Examples of the first and second growth-inhibiting liners include corresponding growth-inhibiting liners 367 and 365 of FIG. 3E, or the like. From block 612, flow proceeds to block 614.

Regarding block 612, in some embodiments, the first growth-inhibiting liner (e.g., 367) extends down the first and second recesses (e.g., 322) the second channel-stack (e.g., 304(2)) to a first depth corresponding to the isolation boundary layer (e.g., 309). Also, the second growth-inhibiting liner (e.g., 365) extends down the first and second recesses (e.g., 322) of the first channel-stack (e.g., 304(1)) to a second depth corresponding to all the first sacrificial layers (e.g., 306), the second depth being greater than the first depth.

Regarding block 612, and further regarding the selective formation of the first and second growth-inhibiting liners, in some embodiments: a first amount of the insulating material in each of the first and second recesses (e.g., 322) of the second channel-stack (e.g., 304(2)) is removed (e.g., FIG. 3C) to a first depth corresponding to the isolation boundary layer (e.g., 309) resulting in first (322') and second (322') partially-filled recesses; and a second amount of the insulating material in each of the first and second recesses (e.g., 322) of the first channel-stack (e.g., 304(1)) is removed to a second depth corresponding to all the first sacrificial layers (e.g., 309), the second depth being greater than the first depth.

Regarding block 612, and further regarding the removal of the first amount of insulating material in each of the first and second recesses of the second channel-stack, in some embodiments: first and second alpha masks (e.g., PR1) are formed correspondingly over the first (e.g., 304(1)) and third (e.g., 304(3)) channel-stacks as in, e.g., FIG. 3C; and the insulating material in each of the first and second recesses (e.g., 322) of the second channel-stack (e.g., 304(2)) is etched to remove the first amount of the insulating material, e.g., as in FIG. 3C.

Regarding block 612, and further regarding the removal of the second amount of insulating material in each of the first and second recesses of the first channel-stack, in some embodiments: first and second beta masks (e.g., PR2) are formed correspondingly over the second (e.g., 304(2)) and third (e.g., 304(3)) channel-stacks, e.g., as in FIG. 3D; and the insulating material in each of the first and second recesses (e.g., 322) of the first channel-stack (e.g., 304(1)) is etched to remove the second amount of the insulating material, e.g., as in FIG. 3D.

Regarding block 612, and further regarding the selective formation of the first and second growth-inhibiting liners, in some embodiments: growth-inhibiting material is deposited on exposed surfaces in the first and second recesses (e.g., 322) of the first (e.g., 304(1)) and second (e.g., 304(2)) stacks, e.g., as in FIG. 3E; and the insulating material is removed (e.g., by etching) in each of the first and second recesses (e.g., 322) of each of the second (e.g., 304(2)) and third (e.g., 304(3)) channel-stacks, e.g., as in FIG. 3F.

At block 614, first source/drain (S/D) features of a first conductivity type are formed. Block 614 includes blocks 616-618. At block 616, the first and second recesses of the second channel-stack are partially filled resulting in shorter first S/D features and first and second partially filled recesses, where the shorter first S/D features of the second channel-stack are shorter than the taller first S/D features of the third channel-stack (block 618). An example of the first and second recesses of the second channel-stack being partially filled to result in shorter first S/D features is recesses 322 of channel-stack 304(2) being partially filled with S/D features 328(1), where S/D features 328(1) have P-type conductivity. From block 616, flows to block 618.

At block 618, the first and second recesses of the third channel-stack are filled resulting in taller first S/D features, where the taller first S/D features of the third channel-stack are taller than the shorter first S/D features of the second channel-stack (block 616). An example of the first and second recesses of the third channel-stack being filled to result in taller first S/D features is recesses 322 of channel-stack 304(3) being filled with S/D features 328(2), where S/D features 328(2) have P-type conductivity. From block 618, flow exits block 614 and proceeds to block 620.

Regarding each of blocks 616 and 618, in some embodiments, the first S/D features are formed as follows. First S/D material is grown (e.g., by an epitaxial process appropriate to the corresponding conductivity-type) on exposed sidewalls of the inner spacers (e.g., 326) and sidewalls of the precursor-active layers (e.g., 308) of each of the second (e.g., 304(2)) and third (e.g., 304(3)) channel-stacks which are not covered by the first (e.g., 367) or second (e.g., 365) growth-inhibiting liners, e.g., as in FIG. 3G.

Regarding block 616, i.e., regarding the formation of the shorter first S/D features, in some embodiments, a portion of each of the shorter first S/D features is replaced with a second sacrificial layer (e.g., 369). In some embodiments, the portion of the shorter first S/D features that is to be replaced is in a stratum of the shorter first S/D features (e.g., 328(1)) in the first and second recesses (322) of the second channel-stack (e.g., 304(2)) that corresponds, relative to the Z-axis, to the isolation boundary layer (e.g., 309).

At block 620, the first and second growth-inhibiting liners are removed. An example of the first and second growth-inhibiting liners having been removed is the transition from FIG. 3G to FIG. 3H, or the like. The first (e.g., 367) and second (e.g., 365) growth-inhibiting liners are present in FIG. 3G, but have been removed (e.g., by etching) in FIG. 3H. From block 620, flow proceeds to block 622.

At block 622, second source/drain (S/D) features of a second conductivity type are formed. Block 622 includes blocks 624-626. At block 624, the first and second partially-filled recesses of the second channel-stack are fully filled resulting in shorter second S/D features formed over the shorter first S/D features, where the shorter second S/D features of the second channel-stack are shorter than the taller second S/D features of the first channel-stack (block 626). An example of the first and second recesses of the second channel-stack being fully filled to result in shorter second S/D features are the partially filled recesses 322 of channel-stack 304(2) in FIG. 3H being fully filled with S/D features 328(4), where S/D features 328(4) have N-type conductivity. From block 624, flows to block 626.

At block 626, the first and second recesses of the first channel-stack are filled resulting in taller second S/D features, where the taller second S/D features of the first channel-stack are taller than the shorter second S/D features of the second channel-stack (block 624). An example of the first and second recesses of the first channel-stack being filled to result in taller second S/D features is recesses 322 of channel-stack 304(1) being filled with S/D features 328 (3), where S/D features 328(3) have N-type conductivity. Because each of the first and second recesses (e.g., 322) of the second channel-stack (e.g., 304(2)) are partially filled with an instance of the shorter first S/D feature (e.g., 328(1)) and an instance of the second sacrificial layer (e.g., 369), the second S/D features (e.g., 328(4)) grown in the first and second recesses (e.g., 322) of the second channel-stack (e.g., 304(2)) are relatively shorter in comparison to the second S/D features (e.g., 328(3)) in the first and second recesses (e.g., 322) of the first channel-stack (e.g., 304(1)). Because the first and second recesses (e.g., 322) of the first channel-stack (e.g., 304(1)) are substantially empty, the second S/D features (e.g., 328(3)) grown in the first and second recesses (e.g., 322) of the first channel-stack (e.g., 304(1)) are relatively taller in comparison to the second S/D features (e.g., 328(4)) grown in the first and second recesses (e.g., 322) of the second channel-stack (e.g., 304(2)). From block 626, flow exits block 622 and proceeds to block 628.

Regarding each of blocks 624 and 626, in some embodiments, the second S/D features are formed as follows. After the first and second liners are removed, second S/D material is grown (e.g., by an epitaxial process appropriate to the corresponding conductivity-type) on exposed sidewalls of the inner spacers (e.g., 326) and sidewalls of the precursor-active layers (e.g., 308) of each of the first (e.g., 304(1)) and second (e.g., 304(2)) channel-stacks.

At block 628, the dummy GH structures and the first sacrificial layers are removed. An example of the dummy GH structure and the first sacrificial layers having been removed is the transition from FIG. 3I to FIG. 3J, or the like. An example of the removal process is etching, or the like. In some embodiments, removal of the dummy GH structures and the first sacrificial layers results in voids in each of the first (e.g., 304(1), second (e.g., 304(2)) and third (e.g., 304(3)) channel-stacks. From block 628, flow proceeds to block 630.

Regarding block 628 and the example thereof represented by the transition from FIG. 3I to FIG. 3J, in some embodiments, the transition from FIG. 3I to FIG. 3J is as follows: a first contact etch stop layer (CESL) (not shown) is deposited, then first interlayer dielectric (ILD) structures (e.g., 373) are deposited, then the dummy GH structures (e.g., 318) are removed, then the first sacrificial layers (e.g., 306) are selectively removed to release precursor-active layers (e.g., 308) as active layers (e.g., 3080), and then the second sacrificial layers (e.g., 369) are removed. In some embodiments, the second sacrificial layers (e.g., 369) are removed and then the first sacrificial layers (e.g., 306) are selectively removed to release the precursor-active layers (e.g., 308) as active layers (e.g., 3080). In some embodiments, the removal of the second sacrificial layers (e.g., 369) results in corresponding voids.

At block 630, components of gate structures are formed in the voids in each of the first (e.g., 304(1), second (e.g., 304(2)) and third (e.g., 304(3)) channel-stacks. Examples of the components of the gate structures include gate-head (GH) structures 338 and active layers 3080. In some embodiments, such voids are then filled with conductive material, e.g., as in FIG. 3K.

Figure 7:
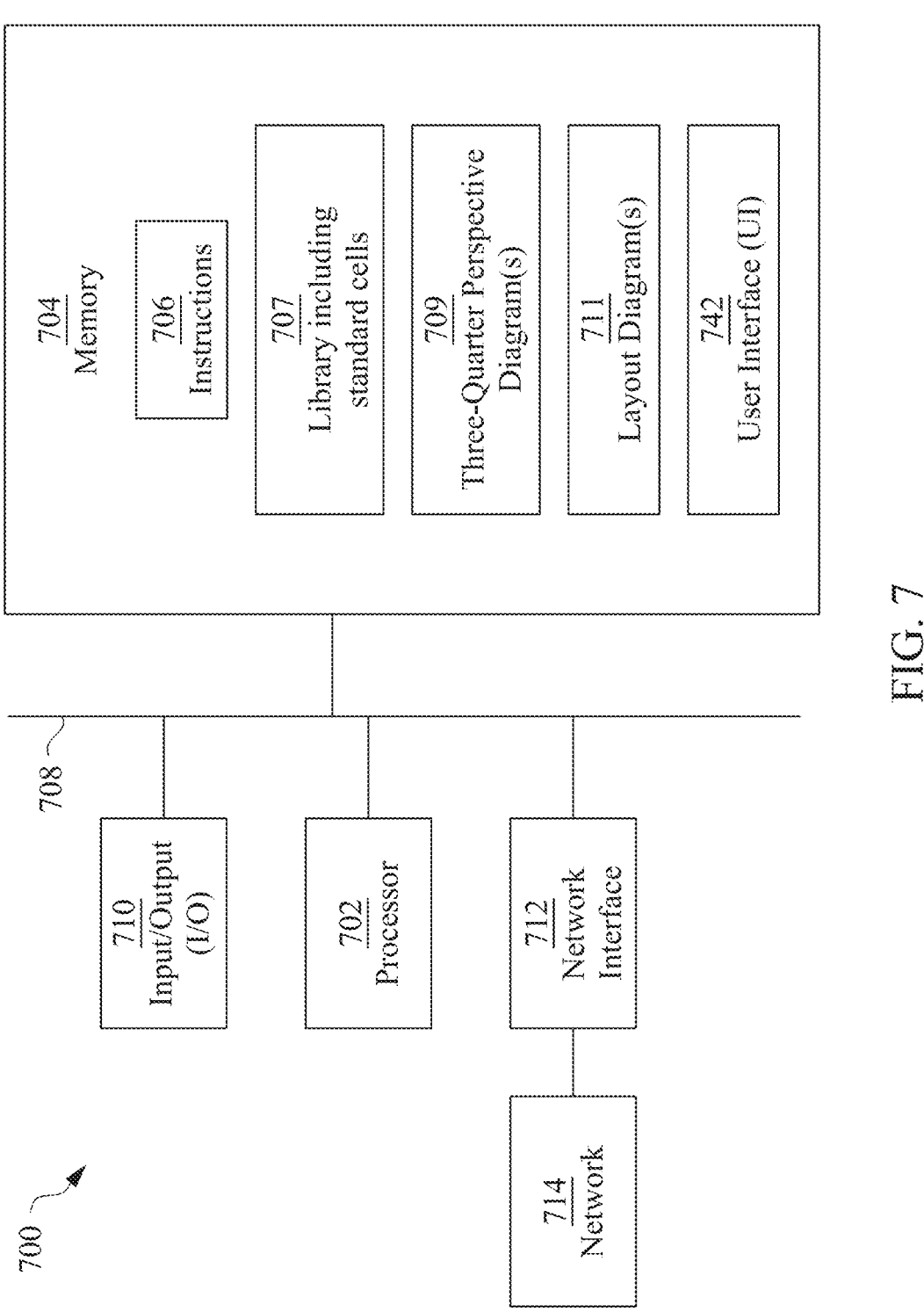
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the methods of FIGS. 6A-6B, in accordance with one or more embodiments (hereinafter, the noted processes and/or methods). Storage medium 704, amongst other things, stores layout diagram disclosed herein, other the like.

Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 707 of standard cells including such standard cells as disclosed herein. In some embodiments, storage medium 704 stores one or more three-quarter perspective diagrams 709. In some embodiments, storage medium 704 stores one or more layout diagrams 711.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a user interface (UI) through I/O interface 710. The information is stored in computer-readable medium 704 as UI 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
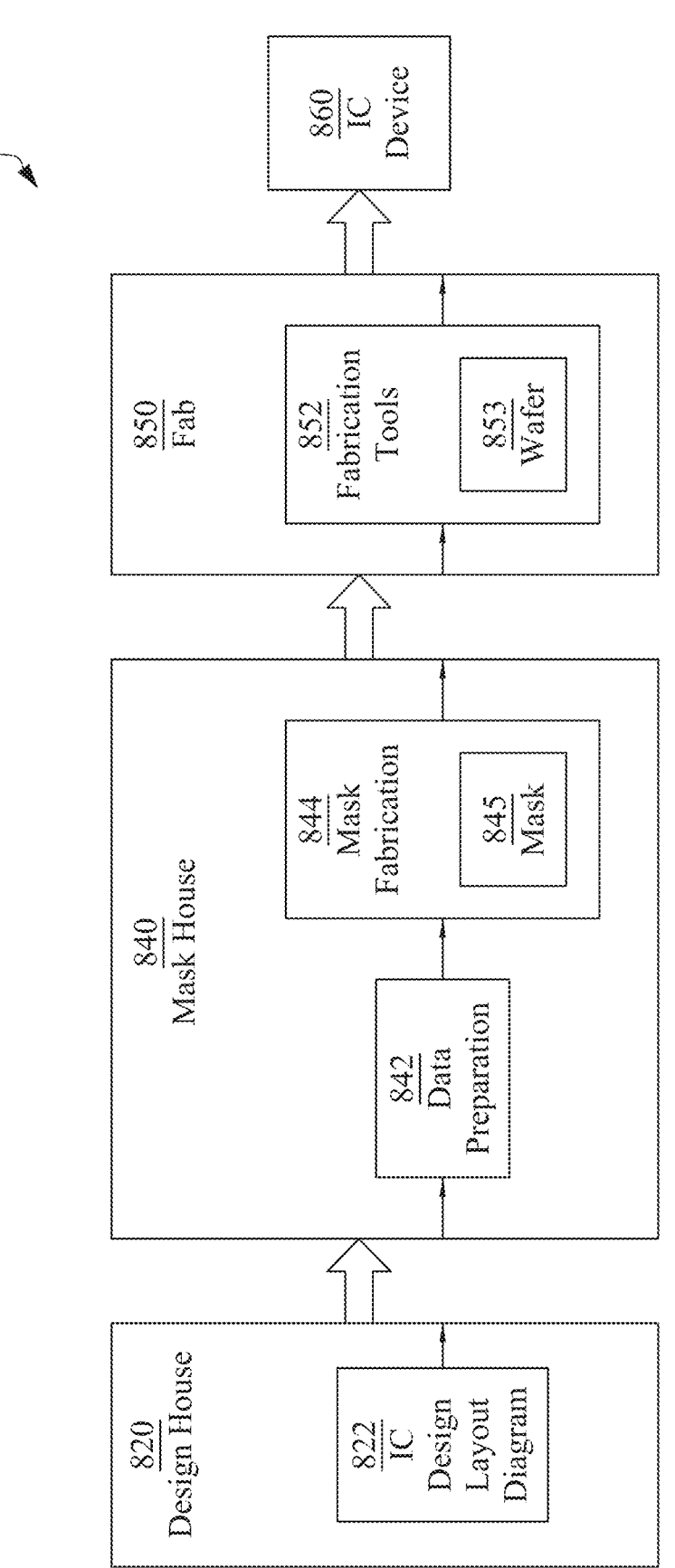
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

Based on the layout diagram generated by block 602 of FIG. 6A, the IC manufacturing system 800 implements block 604 of FIG. 6A wherein at least one of (A) one or more semiconductor masks or (B) at least one component in a layer of an inchoate semiconductor integrated circuit is fabricated using manufacturing system 800. In some embodiments, blocks 610-614 of FIG. 6B are implemented by the IC manufacturing system 800 in order to perform block 604 of FIG. 6A.

In FIG. 8, IC manufacturing system 800 includes entities, such as a design house 820, a mask house 840, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 840, and IC fab 850 is owned by a single larger company. In some embodiments, two or more of design house 820, mask house 840, and IC fab 850 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 840 includes data preparation 832 and mask fabrication 834. Mask house 840 uses IC design layout 822 to manufacture one or more masks to be used for fabricating the various layers of IC device 860 according to IC design layout 822. Mask house 840 performs mask data preparation 832, where IC design layout 822 is translated into a representative data file ("RDF"). Mask data preparation 832 supplies the RDF to mask fabrication 834. Mask fabrication 834 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 850. In FIG. 8, mask data preparation 832, mask fabrication 834, and mask 845 are illustrated as separate elements. In some embodiments, mask data preparation 832 and mask fabrication 834 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 822.

The above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 834, a mask 845 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 850 is an IC fabrication business that includes one or more manufacturing facilities for the fabrication of a variety of different IC products. In some embodiments, IC fab 850 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 850 uses the mask (or masks) fabricated by mask house 840 to fabricate IC device 860 using fabrication tools 852. Thus, IC fab 850 at least indirectly uses IC design layout 822 to fabricate IC device 860. In some embodiments, a semiconductor wafer 842 is fabricated by IC fab 850 using the mask (or masks) to form IC device 860. Semiconductor wafer 842 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a semiconductor device (having a mixed complementary metal oxide semiconductor (CMOS) architecture) includes cell regions, each of which includes first and second active regions, the cell regions including: first or second cell regions, each of the first and second active regions thereof including a pair of first and second stacks of nanosheets relative to a first direction, the nanosheets of the first stack having a first dopant-type, the nanosheets of the second stack having a second dopant type different than the first dopant type, each pair of first and second stacks representing a complementary metal oxide semiconductor (CMOS) architecture relative to a second direction perpendicular to the first direction; and third and fourth cell regions, each of which has a complementary field effect transistor (CFET) architecture, the CFET architecture being a type of CMOS architecture relative to the first direction; the third and fourth cell regions being adjacent each other relative to the second direction; and the third and fourth cell regions being between the first and second active regions relative to a third direction perpendicular to each of the first direction second directions.

In some embodiments, the first and second active regions of each of the first and second cell regions are correspondingly homogeneous in terms of dopant type relative to the first direction; each of the third and fourth cell regions includes first and second active regions, each of the first and second active regions including a first stack of nanosheets having a first conductivity-type and a second stack of nanosheets having a second conductivity-type in a stratified arrangement relative to the first direction; and the first and second active regions of each of the third and fourth cell regions are heterogeneous in terms of dopant type relative to the first direction.

In some embodiments, each of the cell regions includes layers of active regions (active layers); each of the first and second active regions of each of the first and second cell regions includes four active layers; and each of the first and second active regions of each of the third and fourth cell regions includes two active layers.

In some embodiments, each active layer of each of the first and second active regions of each of the first and second cell regions includes one nanosheet.

In some embodiments, each active layer of each of the first and second active regions of each of the third and fourth cell regions includes one nanosheet.

In some embodiments, each of the cell regions has a corresponding area in terms of the second direction and a third direction perpendicular to each of the first and second directions; and the area of each of the first and second cell regions is substantially the same; the area of each of the third and fourth cell regions is substantially the same; and a sum of the areas of the third and fourth cell regions is substantially the same as the area of each of the first and second cell regions.

In some embodiments, relative to the second direction, each of the third and fourth cell regions is between the first and second cell regions; relative to the second direction, the third cell region abuts the fourth cell region; and relative to the third direction, the semiconductor device is: free from a first other cell region being between the first cell region and the third cell region; free from a second other cell region being between the first cell region and the fourth cell region; free from a third other cell region being between the second cell region and the third cell region; and free from a fourth other cell region being between the second cell region and the fourth cell region.

In some embodiments, relative to the third direction, the first cell region abuts each of the third and fourth cell regions; and relative to the third direction, the second cell region abuts each of the third and fourth cell regions.

In some embodiments, each of the cell regions has a border relative to the second and third directions; and in terms of a reference line extending in the third direction, and further in terms of changes in intersection-location where the reference line intersects each cell-region-border as the reference line is swept in the second direction: a transition from the first cell region to the third cell region is free of a substantial step-change in the intersection-location; a transition from the first cell region to the fourth cell region is free of a substantial step-change in the intersection-location; a transition from the third cell region to the second cell region is free of a substantial step-change in the intersection-location; and a transition from the fourth cell region to the second cell region is free of a substantial step-change in the intersection-location.

In some embodiments, a semiconductor device includes cell regions, each cell region including layers having one or more active regions (active layers), the active layers of each cell region being stacked in a stratified arrangement relative to a first direction, and the cell regions including: first or second cell regions each of which further includes an isolation boundary layer which separates first and second sets of the active layers therein relative to the first direction, each active layer therein including first and second active regions separated from each other relative to a second direction perpendicular to the first direction, each first active region therein having a first dopant type and each second active region therein having a second dopant type different than the first dopant type such that each active layer therein is heterogeneous in terms of dopant type, relative to the first direction, the first active regions therein being in corresponding first stacks over each other and the second active regions therein being in corresponding second stacks over each other, and each of the first and second stacks therein being correspondingly homogeneous in terms of dopant type; and third and fourth cell regions adjacent each other relative to the second direction, each of which further includes an isolation boundary layer which separates first and second sets of the active layers therein relative to the first direction, each active layer therein including a single active region, the single active regions therein being in corresponding third stacks over each other; regarding the isolation boundary layer and relative to the first direction, each single active region therebelow having the first dopant type and each single active region thereabove having the second dopant type such that each active layer therein is homogeneous in terms of dopant type; and each third stack therein being correspondingly heterogeneous in terms of dopant type; and the third and fourth cell regions being between the first and second active regions relative to a third direction perpendicular to each of the first direction second directions.

In some embodiments, each of the cell regions has a corresponding area in terms of the second and third directions; and the area of each of the first and second cell regions is substantially the same; the area of each of the third and fourth cell regions is substantially the same; and a sum of the areas of the third and fourth cell regions is substantially the same as the area of each of the first and second cell regions.

In some embodiments, relative to a third direction perpendicular to the first and second directions, each of the third and fourth cell regions is between the first and second cell regions; relative to a second direction perpendicular to the each of the first and third directions, the third cell region abuts the fourth cell region; and relative to the third direction, the semiconductor device is: free from a first other cell region being between the first cell region and the third cell region; free from a second other cell region being between the first cell region and the fourth cell region; free from a third other cell region being between the second cell region and the third cell region; and free from a fourth other cell region being between the second cell region and the fourth cell region.

In some embodiments, relative to the third direction, the first cell region abuts each of the third and fourth cell regions; and relative to the third direction, the second cell region abuts each of the third and fourth cell regions.

In some embodiments, each of the cell regions has a border relative to the second and third directions; and in terms of a reference line extending in the second direction, and further in terms of changes in intersection-location where the reference line intersects each cell-region-border as the reference line is swept in the third direction, a transition from the first cell region to the third cell region is free of a substantial step-change in the intersection-location; a transition from the first cell region to the fourth cell region is free of a substantial step-change in the intersection-location; a transition from the third cell region to the second cell region is free of a substantial step-change in the intersection-location; and a transition from the fourth cell region to the second cell region is free of a substantial step-change in the intersection-location.

In some embodiments, each of the first and second active regions of each active layer of each of the first and second cell regions has a nanosheet-type architecture.

In some embodiments, each of the first and second stacks in each of the first and second cell regions includes four nanosheets.

In some embodiments, each of the third and fourth cell regions has a complementary field effect transistor (CFET) architecture.

In some embodiments, each active region of each active layer of each of the third and fourth cell regions has a nanosheet-type architecture.

In some embodiments, a method (of forming a semiconductor device) includes forming first, second and third channel-stacks on a substrate, each of which including precursor-active layers and first sacrificial layers which are interleaved relative to a first direction and an isolation boundary layer above which is a predetermined number of the first sacrificial layers representing some but not all thereof, and each of which being separated on first and second sides, relative to a second direction perpendicular to the first direction, from nearest other structures by corresponding first and second recesses; forming first source/drain (S/D) features of a first conductivity type including partially filling the first and second recesses of the second channel-stack with a first S/D material resulting in first and second partially-filled recesses, and filling the first and second recesses of the third channel-stack with the first S/D material; and forming second S/D features of a second conductivity type including filling the first and second partially-filled recesses of the second channel-stack with a second S/D material, and filling the first and second recesses of the first channel-stack with the second S/D material.

In some embodiments, the forming first S/D features further includes: in each of the first and second recesses of each of the first, second and third channel-stacks, forming inner spacers against sidewalls of the first sacrificial layers of the first, second and third channel-stacks; and filling each of the first and second recesses of each of the first, second and third channel-stacks with an insulating material.

In some embodiments, each of the first, second and third channel-stacks further includes inner spacers against sidewalls of the first sacrificial layers; each of the first and second recesses of each of the first, second and third channel-stacks is filled with an insulating material; and the method further includes: selectively forming first and second growth-inhibiting liners against sidewalls of the inner spacers and sidewalls of the precursor-active layers correspondingly of each of the first and second channel-stacks such that the first growth-inhibiting liner extends down the first and second recesses of the second channel-stack to a first depth corresponding to the isolation boundary layer and the second growth-inhibiting liner extends down the first and second recesses of the first channel-stack to a second depth corresponding to all the first sacrificial layers, the second depth being greater than the first depth.

In some embodiments, each of the first, second and third channel-stacks further includes inner spacers against sidewalls of the first sacrificial layers; each of the first and second recesses of each of the first, second and third channel-stacks is filled with an insulating material; and the selectively forming first and second growth-inhibiting liners further includes: removing a first amount of the insulating material in each of the first and second recesses of the second channel-stack to a first depth corresponding to the isolation boundary layer resulting in first and second partially-filled recesses; and removing a second amount of the insulating material in each of the first and second recesses of the first channel-stack to a second depth corresponding to all the first sacrificial layers, the second depth being greater than the first depth.

In some embodiments, the removing a first amount of the insulating material in each of the first and second recesses of the second channel-stack includes: forming first and second alpha masks correspondingly over the first and third channel-stacks; and etching the insulating material in each of the first and second recesses of the second channel-stack to remove the first amount of the insulating material.

In some embodiments, the removing a second amount of the insulating material in each of the first and second recesses of the first channel-stack includes: forming first and second beta masks correspondingly over the second and third channel-stacks; and etching the insulating material in each of the first and second recesses of the first channel-stack to remove the second amount of the insulating material.

In some embodiments, the selectively forming first and second growth-inhibiting liners further includes: depositing growth-inhibiting material on exposed surfaces in the first and second recesses of the first and second channel-stacks; and removing the insulating material in each of the first and second recesses of each of the first and second channel-stacks.

In some embodiments, the removing the insulating material in each of the first and second recesses of each of the first and second channel-stacks includes: etching the insulating material in each of the first and second recesses of each of the first and second channel-stacks.

In some embodiments, each of the first, second and third channel-stacks further includes inner spacers against sidewalls of the first sacrificial layers; the second channel-stack further includes a first growth-inhibiting liner that extends down the first and second recesses of the second channel-stack to a first depth corresponding to the isolation boundary layer; the first channel-stack further includes a second growth-inhibiting liner that extends down the first and second recesses of the first channel-stack to a second depth corresponding to all the first sacrificial layers, the second depth being greater than the first depth; and the forming first S/D features further includes growing the first S/D material on exposed sidewalls of the inner spacers and sidewalls of the precursor-active layers correspondingly of each of the second and third channel-stacks which are not covered by the first or second growth-inhibiting liners.

In some embodiments, the forming first S/D features further includes, for a stratum of the first S/D material in the first and second recesses of the second channel-stack that corresponds, relative to the first direction, to the isolation boundary layer, replacing the stratum with a second sacrificial layer.

In some embodiments, the forming first S/D features further includes: removing the first and second growth-inhibiting liners; and growing the second S/D material on remaining exposed surfaces in the first and second recesses of each of the first and second channel-stacks.

In some embodiments, the removing the first and second growth-inhibiting liners includes etching the first and second growth-inhibiting liners.

In some embodiments, each of the first, second and third channel-stacks further includes a dummy gate-head structure over an uppermost one of the precursor-active layers; and the method further includes: for each of the first, second and third channel-stacks, converting the dummy gate-head structure and the first sacrificial layers into corresponding components of a gate structure.

In some embodiments, for each of the first, second and third channel-stacks, the converting includes: removing the dummy gate-head structure and the first sacrificial layers resulting in corresponding voids; and forming conductive material in the voids.

In some embodiments, the removing the dummy gate-head structure and the first sacrificial layers includes etching the dummy gate-head structure and the first sacrificial layers.

In some embodiments, in the first and second recesses of the second channel-stack, a second sacrificial layer is formed in a same stratum as the isolation boundary layer of the second channel-stack; and the forming second S/D features further includes in each of each of the first and second recesses of the second channel-stack, manipulating the second sacrificial layer to provide greater dielectric isolation as compared to the second sacrificial layer.

In some embodiments, the manipulating the second sacrificial layer includes removing the second sacrificial layer resulting in a void where the second sacrificial layer had been.

In some embodiments, the removing the second sacrificial layer includes etching the second sacrificial layer.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device having a mixed complementary metal oxide semiconductor (CMOS) technology, the semiconductor device comprising:

cell regions, each of which includes first and second active regions, the cell regions including:

first and second cell regions, each of the first and second active regions thereof including a pair of first and second stacks of nanosheets relative to a first direction, the nanosheets of the first stack having a negative-channel field effect (NMOS) configuration or a positive-channel field effect (PMOS) configuration and the nanosheets of the second stack having conversely having a PMOS configuration or an NMOS configuration, and each pair of first and second stacks representing CMOS technology relative to a second direction perpendicular to the first direction; and third and fourth cell regions, each of which including an NMOS active region and a PMOS active region and each of the third and fourth cell regions having a complementary field effect transistor (CFET) architecture;

the third and fourth cell regions being adjacent each other relative to the second direction; and the third and fourth cell regions being between the first and second active regions relative to a third direction perpendicular to each of the first direction and the second directions.

2. The semiconductor device of claim 1, wherein:

each of the NMOS active region and the PMOS active region of each of the third and fourth cell regions including a third stack of nanosheets having the NMOS configuration or the PMOS configuration and a fourth stack of nanosheets conversely having the PMOS configuration or the NMOS configuration in a stratified arrangement relative to the first direction.

3. The semiconductor device of claim 1, wherein:

each of the first, second, third and fourth cell regions includes layers of active regions (active layers);

each of the first and second active regions of each of the first and second cell regions includes four active layers; and each of the NMOS active region and the PMOS active region of each of the third and fourth cell regions includes two active layers.

4. The semiconductor device of claim 1, wherein:
each of the cell regions includes layers of active regions
(active layers); and
each active layer of each of the first and second active
regions of each of the first and second cell regions
includes one nanosheet.

5. The semiconductor device of claim 4, wherein:
each active layer of each of the NMOS active region and
the PMOS active region of each of the third and fourth
cell regions includes one nanosheet.

6. The semiconductor device of claim 1, wherein:
each of the cell regions has a corresponding area in terms
of the second direction and the third direction perpen-
dicular to each of the first and second directions;
the area of each of the first and second cell regions is
substantially the same;
the area of each of the third and fourth cell regions is
substantially the same; and
a sum of the areas of the third and fourth cell regions is
substantially the same as the area of each of the first and
second cell regions.

7. The semiconductor device of claim 1, wherein:
relative to the second direction, each of the third and
fourth cell regions is between the first and second cell
regions;
relative to the second direction, the third cell region abuts
the fourth cell region; and
relative to the third direction, the semiconductor device is:
free from a first other cell region being between the first
cell region and the third cell region;
free from a second other cell region being between the
first cell region and the fourth cell region;
free from a third other cell region being between the
second cell region and the third cell region; and
free from a fourth other cell region being between the
second cell region and the fourth cell region.

8. The semiconductor device of claim 7, wherein:
relative to the third direction, the first cell region abuts
each of the third and fourth cell regions; and
relative to the third direction, the second cell region abuts
each of the third and fourth cell regions.

9. The semiconductor device of claim 1, wherein:
each of the cell regions has a border relative to the second
and third directions; and
in terms of a reference line extending in the third direc-
tion,
and further in terms of changes in intersection-location
where the reference line intersects each cell-region-
border as the reference line is swept in the second
direction,
a transition from the first cell region to the third cell
region is free of a substantial step-change in the
intersection-location;
a transition from the first cell region to the fourth cell
region is free of a substantial step-change in the
intersection-location;
a transition from the third cell region to the second
cell region is free of a substantial step-change in
the intersection-location; and
a transition from the fourth cell region to the second
cell region is free of a substantial step-change in
the intersection-location.

10. A semiconductor device comprising:
cell regions, each cell region including layers having one
or more active regions (active layers), the active layers
of each cell region being stacked in a stratified arrange-
ment relative to a first direction, each cell region further including an isolation boundary layer which separates
first and second sets of the active layers therein relative
to the first direction; and
the cell regions including:
first and second cell regions,
each active layer therein including first and second
active regions separated from each other relative
to a second direction perpendicular to the first
direction,
each first active region therein having a first dopant-
type and each second active region therein having
a second dopant-type different than the first dop-
ant-type such that each active layer therein is
heterogeneous in terms of dopant-type,
relative to the first direction, the first active regions
therein being in corresponding first stacks over
each other and the second active regions therein
being in corresponding second stacks over each
other, and
each of the first and second stacks therein being
correspondingly homogeneous in terms of dopant-
type; and
third and fourth cell regions adjacent each other relative
to the second direction,
each active layer therein including a single active
region,
the single active regions therein being in correspond-
ing third stacks over each other, and
regarding the isolation boundary layer and relative to
the first direction, each single active region ther-
ebelow having the first dopant-type and each
single active region thereabove having the second
dopant-type such that each active layer therein is
homogeneous in terms of dopant-type; and
each third stack therein being correspondingly het-
erogeneous in terms of dopant-type; and
the third and fourth cell regions being between the first
and second active regions relative to a third direction
perpendicular to each of the first and second directions.

11. The semiconductor device of claim 10, wherein:
each of the cell regions has a border relative to the second
and third directions; and
in terms of a reference line extending in the second
direction,
and further in terms of changes in intersection-location
where the reference line intersects each cell-region-
border as the reference line is swept in the third
direction,
a transition from the first cell region to the third cell
region is free of a substantial step-change in the
intersection-location;
a transition from the first cell region to the fourth cell
region is free of a substantial step-change in the
intersection-location;
a transition from the third cell region to the second
cell region is free of a substantial step-change in
the intersection-location; and
a transition from the fourth cell region to the second
cell region is free of a substantial step-change in
the intersection-location.

12. The semiconductor device of claim 10, wherein:
each of the first and second active regions of each active
layer of each of the first and second cell regions has a
nanosheet-type architecture.

13. The semiconductor device of claim 12, wherein:
each of the first and second stacks in each of the first and
second cell regions includes four nanosheets.

14. The semiconductor device of claim 10, wherein:

each of the third and fourth cell regions has a complementary field effect transistor (CFET) architecture.

15. The semiconductor device of claim 10, wherein:

each of the cell regions has a corresponding area in terms of the second direction and a third direction perpendicular to each of the first and second directions; and the area of each of the first and second cell regions is substantially the same;

the area of each of the third and fourth cell regions is substantially the same; and a sum of the areas of the third and fourth cell regions is substantially the same as the area of each of the first and second cell regions.

16. A semiconductor device having a mixed complementary metal oxide semiconductor (CMOS) technology, the semiconductor device comprising:

cell regions, each of which being a type of complementary metal oxide semiconductor (CMOS) technology, and each of which including first and second active regions, the cell regions including:

first and second cell regions, each of which representing a first architecture relative to a first direction, the first architecture being a complementary field effect transistor (CFET) architecture; and third and fourth cell regions, each of the first and second active regions thereof including a pair of first and second stacks of nanosheets relative to the first direction, the nanosheets of the second stack having a different dopant-type different than the nanosheets of the first stack, each pair of the first and second stacks representing a second architecture relative to a second direction perpendicular to the first direction, the second architecture being different than a non-CFET architecture; and each of the first and second cell regions being between the third and fourth cell regions relative to a third direction perpendicular to each of the first and second directions.

17. The semiconductor device of claim 16, wherein:

the first and second cell regions being adjacent each other relative to the second direction.

18. The semiconductor device of claim 16, wherein:

each of the cell regions includes layers of active regions (active layers);

each of first and second active regions of each of the third and fourth cell regions includes four active layers; and each of first and second active regions of each of the first and second cell regions includes two active layers.

19. The semiconductor device of claim 16, wherein:

each of the cell regions includes layers of active regions (active layers);

each active layer of each of first and second active regions of each of the third and fourth cell regions includes one nanosheet; and each active layer of each of the first and second active regions of each of the third and fourth cell regions includes one nanosheet.

20. The semiconductor device of claim 16, wherein:

each of the cell regions has a corresponding area in terms of the second direction and a third direction perpendicular to each of the first and second directions; and the area of each of the first and second cell regions is substantially the same;

the area of each of the third and fourth cell regions is substantially the same; and a sum of the areas of the third and fourth cell regions is substantially the same as the area of each of the first and second cell regions.

\* \* \* \* \*